(12) United States Patent
Huang et al.

(10) Patent No.: US 12,696,378 B2
(45) Date of Patent: Jul. 28, 2026

(54) CIRCUIT BOARD AND CONNECTOR ASSEMBLY WITH IMPROVED SHIELDING PERFORMANCE

(71) Applicant: DONGGUAN LUXSHARE TECHNOLOGIES CO., LTD, Guangdong City (CN)

(72) Inventors: Bin Huang, Dongguan City (CN); Chenhui Zeng, Dongguan City (CN); Kunlin Yao, Dongguan City (CN); Qiongnan Chen, Dongguan City (CN); Hongji Chen, Dongguan City (CN); Cheng Li, Dongguan City (CN)

(73) Assignee: DONGGUAN LUXSHARE TECHNOLOGIES CO., LTD, Dongguan City (CN)

( * ) Notice: Subject to any disclaimer, the term of this patent is extended or adjusted under 35 U.S.C. 154(b) by 282 days.

(21) Appl. No.: 18/532,101

(22) Filed: Dec. 7, 2023

(65) Prior Publication Data

US 2025/0113431 A1 Apr. 3, 2025

(30) Foreign Application Priority Data

Sep. 28, 2023 (CN) .......................... 202311286998.1

(51) Int. Cl.
*H05K 1/02* (2006.01)

(52) U.S. Cl.
CPC .................................. *H05K 1/0224* (2013.01)

(58) Field of Classification Search
CPC ........................... H05K 1/0224; H05K 1/0296
See application file for complete search history.

(56) References Cited

U.S. PATENT DOCUMENTS

| | | | |
|---|---|---|---|
| 4,703,986 A | 11/1987 | McCormick |
| 6,361,373 B1 | 3/2002 | Horchler |
| 7,128,588 B2 | 10/2006 | Hu et al. |
| 7,297,024 B2 | 11/2007 | Ni et al. |
| 8,858,237 B2 | 10/2014 | Hsu et al. |

(Continued)

FOREIGN PATENT DOCUMENTS

| | | |
|---|---|---|
| CN | 1663081 A | 8/2005 |
| CN | 2796175 Y | 7/2006 |

(Continued)

OTHER PUBLICATIONS

U.S. Notice of Allowance for U.S. Appl. No. 16/530,868, dated Feb. 9, 2026.

(Continued)

*Primary Examiner* — Jeremy C Norris
(74) *Attorney, Agent, or Firm* — Birch, Stewart, Kolasch & Birch, LLP

(57) ABSTRACT

A circuit board includes a first signal conductive area, a second signal conductive area, a first ground conductive area and a second ground conductive area. The first signal conductive area and the second signal conductive area both extend along a first direction. The first ground conductive area and the second ground conductive area are located on two sides of the first signal conductive area and the second signal conductive area, respectively, thereby improving shielding effect. A connector assembly including the circuit board is also disclosed.

19 Claims, 33 Drawing Sheets

(56)　　　　　References Cited

U.S. PATENT DOCUMENTS

| | | | |
|---|---|---|---|
| 9,350,121 | B2 | 5/2016 | Ju et al. |
| 9,401,570 | B2 | 7/2016 | Phillips et al. |
| 9,450,355 | B2 | 9/2016 | Zhang |
| 9,461,378 | B1 | 10/2016 | Chen |
| 9,478,889 | B2 | 10/2016 | Oshida |
| 9,509,098 | B1 | 11/2016 | Henry et al. |
| 9,799,994 | B2 | 10/2017 | Chen |
| 9,812,823 | B2 | 11/2017 | Kawakami et al. |
| 9,972,945 | B1 | 5/2018 | Huang et al. |
| 10,050,365 | B1 | 8/2018 | Ju |
| 10,103,501 | B2 | 10/2018 | Lin et al. |
| 10,276,983 | B2 | 4/2019 | Arai et al. |
| 10,714,877 | B2 | 7/2020 | Zhou |
| 10,763,624 | B1 | 9/2020 | Henry et al. |
| 11,031,708 | B2 | 6/2021 | Teh |
| 11,108,194 | B2 | 8/2021 | Lin et al. |
| 11,189,972 | B2 | 11/2021 | Casher et al. |
| 11,196,220 | B2 | 12/2021 | Tu et al. |
| 11,283,221 | B2 | 3/2022 | Hsuch et al. |
| 11,749,947 | B2 | 9/2023 | Huang et al. |
| 11,984,680 | B2 | 5/2024 | Fan et al. |
| 12,294,187 | B2 | 5/2025 | Liu et al. |
| 2002/0115318 | A1 | 8/2002 | Apicelli |
| 2003/0143894 | A1 | 7/2003 | Kline et al. |
| 2003/0180011 | A1* | 9/2003 | Aronson ............ H01R 13/6585 |
| | | | 385/92 |
| 2006/0270254 | A1 | 11/2006 | Chiang et al. |
| 2009/0305574 | A1 | 12/2009 | Chen et al. |
| 2010/0210139 | A1 | 8/2010 | Wei |
| 2011/0009001 | A1 | 1/2011 | Chen et al. |
| 2013/0189858 | A1 | 7/2013 | Johnescu et al. |
| 2013/0303005 | A1 | 11/2013 | Chiba et al. |
| 2014/0024257 | A1 | 1/2014 | Castillo et al. |
| 2014/0273585 | A1 | 9/2014 | Dang |
| 2015/0004839 | A1 | 1/2015 | Wang et al. |
| 2015/0111401 | A1 | 4/2015 | Guo |
| 2016/0043511 | A1 | 2/2016 | Hsu |
| 2016/0181734 | A1 | 6/2016 | Kao et al. |
| 2017/0033482 | A1 | 2/2017 | Liao |
| 2017/0033506 | A1 | 2/2017 | Hsu et al. |
| 2017/0070013 | A1 | 3/2017 | Hsu et al. |
| 2017/0207581 | A1 | 7/2017 | Zhang |
| 2017/0352992 | A1 | 12/2017 | Lin et al. |
| 2017/0358885 | A1 | 12/2017 | Okuyama et al. |
| 2018/0294592 | A1 | 10/2018 | Huang et al. |
| 2019/0131745 | A1 | 5/2019 | Zhao et al. |
| 2019/0199028 | A1 | 6/2019 | Maesoba et al. |
| 2019/0221972 | A1 | 7/2019 | Hou et al. |
| 2019/0393634 | A1 | 12/2019 | Kao et al. |
| 2020/0091635 | A1 | 3/2020 | Horii |
| 2020/0176937 | A1 | 6/2020 | Azad |
| 2020/0235535 | A1 | 7/2020 | Tsai et al. |
| 2020/0303854 | A1 | 9/2020 | Jin |
| 2020/0335890 | A1 | 10/2020 | Liu et al. |
| 2020/0343661 | A1 | 10/2020 | Wu et al. |
| 2020/0412067 | A1 | 12/2020 | Xu et al. |
| 2021/0075143 | A1 | 3/2021 | Laurx et al. |
| 2021/0075164 | A1 | 3/2021 | Chen et al. |
| 2021/0194187 | A1 | 6/2021 | Chen et al. |
| 2021/0203107 | A1 | 7/2021 | Liu et al. |
| 2021/0203108 | A1 | 7/2021 | Liu et al. |
| 2021/0296831 | A1 | 9/2021 | Wu et al. |
| 2021/0336386 | A1 | 10/2021 | Wu et al. |
| 2021/0399498 | A1 | 12/2021 | Liu et al. |
| 2022/0006217 | A1 | 1/2022 | Huang et al. |
| 2022/0052469 | A1 | 2/2022 | Huang et al. |
| 2022/0052492 | A1 | 2/2022 | Guo et al. |
| 2022/0115818 | A1 | 4/2022 | Little et al. |
| 2022/0216652 | A1 | 7/2022 | Chen et al. |
| 2022/0224054 | A1 | 7/2022 | Xu et al. |
| 2022/0344854 | A1 | 10/2022 | Huang et al. |
| 2022/0352667 | A1 | 11/2022 | Chen et al. |
| 2023/0128860 | A1 | 4/2023 | Liu et al. |
| 2023/0144251 | A1 | 5/2023 | Lee et al. |
| 2023/0216248 | A1 | 7/2023 | Huang et al. |
| 2023/0238723 | A1 | 7/2023 | Chen et al. |
| 2023/0261425 | A1 | 8/2023 | Sun |
| 2023/0283025 | A1 | 9/2023 | Lin et al. |
| 2023/0318213 | A1 | 10/2023 | Lu |
| 2023/0335934 | A1 | 10/2023 | Fu et al. |
| 2023/0420882 | A1 | 12/2023 | Hsu et al. |
| 2024/0030658 | A1 | 1/2024 | Little |
| 2024/0063564 | A1 | 2/2024 | Hsu et al. |
| 2024/0178620 | A1 | 5/2024 | Li et al. |
| 2024/0235120 | A1 | 7/2024 | Chen et al. |
| 2024/0305027 | A1 | 9/2024 | Xiao et al. |
| 2024/0313476 | A1 | 9/2024 | Tuin et al. |
| 2024/0347955 | A1 | 10/2024 | Huang et al. |
| 2024/0347983 | A1 | 10/2024 | Liu et al. |
| 2024/0364057 | A1 | 10/2024 | Zhu et al. |
| 2024/0413587 | A1 | 12/2024 | Eroglu et al. |
| 2024/0429659 | A1 | 12/2024 | Wu et al. |
| 2025/0047042 | A1 | 2/2025 | Zhang et al. |
| 2025/0055230 | A1 | 2/2025 | Shioda et al. |
| 2025/0055232 | A1 | 2/2025 | Shioda et al. |
| 2025/0079735 | A1 | 3/2025 | Little |

FOREIGN PATENT DOCUMENTS

| | | | |
|---|---|---|---|
| CN | 2891330 | Y | 4/2007 |
| CN | 101453088 | A | 6/2009 |
| CN | 201374459 | Y | 12/2009 |
| CN | 101847800 | A | 9/2010 |
| CN | 201797172 | U | 4/2011 |
| CN | 102170077 | A | 8/2011 |
| CN | 102315560 | A | 1/2012 |
| CN | 102646878 | A | 8/2012 |
| CN | 103296537 | A | 9/2013 |
| CN | 203192962 | U | 9/2013 |
| CN | 203326218 | U | 12/2013 |
| CN | 103579835 | A | 2/2014 |
| CN | 104882691 | A | 9/2015 |
| CN | 105428860 | A | 3/2016 |
| CN | 105789963 | A | 7/2016 |
| CN | 106981762 | A | 7/2017 |
| CN | 107658593 | A | 2/2018 |
| CN | 108493716 | A | 9/2018 |
| CN | 207938913 | U | 10/2018 |
| CN | 108832338 | A | 11/2018 |
| CN | 208062264 | U | 11/2018 |
| CN | 208299135 | U | 12/2018 |
| CN | 110061391 | A | 7/2019 |
| CN | 209592385 | U | 11/2019 |
| CN | 110752486 | A | 2/2020 |
| CN | 111048925 | A | 4/2020 |
| CN | 210430167 | U | 4/2020 |
| CN | 111106478 | A | 5/2020 |
| CN | 107026350 | B | 7/2020 |
| CN | 111641067 | A | 9/2020 |
| CN | 111682366 | A | 9/2020 |
| CN | 111864476 | A | 10/2020 |
| CN | 211957991 | U | 11/2020 |
| CN | 112038803 | A | 12/2020 |
| CN | 112117604 | A | 12/2020 |
| CN | 212412336 | U | 1/2021 |
| CN | 212725822 | U | 3/2021 |
| CN | 213151158 | U | 5/2021 |
| CN | 112886340 | A | 6/2021 |
| CN | 214100121 | U | 8/2021 |
| CN | 214478000 | U | 10/2021 |
| CN | 214478259 | U | 10/2021 |
| CN | 113629429 | A | 11/2021 |
| CN | 215579364 | U | 1/2022 |
| CN | 216120839 | U | 3/2022 |
| CN | 114784552 | A | 7/2022 |
| CN | 217239821 | U | 8/2022 |
| CN | 115117696 | A | 9/2022 |
| CN | 218123877 | U | 12/2022 |
| CN | 115764382 | A | 3/2023 |
| CN | 218677857 | U | 3/2023 |
| CN | 116207537 | A | 6/2023 |
| CN | 219436197 | U | 7/2023 |
| CN | 116526192 | A | 8/2023 |
| CN | 116544691 | A | 8/2023 |

(56)　References Cited

FOREIGN PATENT DOCUMENTS

| | | | |
|---|---|---|---|
| CN | 116667063 | A | 8/2023 |
| CN | 220673019 | U | 3/2024 |
| EP | 0 436 943 | A1 | 7/1991 |
| JP | 2000-67958 | A | 3/2000 |
| JP | 2005-123163 | A | 5/2005 |
| JP | 3154945 | U | 10/2009 |
| JP | 2019-185880 | A | 10/2019 |
| JP | 3238050 | U | 6/2022 |
| KR | 2001-0082007 | A | 8/2001 |
| TW | M253973 | U | 12/2004 |
| TW | 200627723 | A | 8/2006 |
| TW | M531081 | U | 10/2016 |
| TW | M572092 | U | 12/2018 |
| TW | M601917 | U | 9/2020 |
| TW | I759140 | B | 3/2022 |
| TW | M629001 | U | 7/2022 |
| TW | M638656 | U | 3/2023 |
| TW | M643642 | U | 7/2023 |
| WO | WO 2022/171008 | A1 | 8/2022 |
| WO | 2023/119057 | A1 | 6/2023 |

OTHER PUBLICATIONS

U.S. Notice of Allowance for U.S. Appl. No. 18/532,523, dated Jan. 27, 2026.

U.S. Notice of Allowance for U.S. Appl. No. 18/532,315, dated Mar. 10, 2026.

U.S. Notice of Allowance for U.S. Appl. No. 18/532,782, dated Apr. 10, 2026.

U.S. Office Action for U.S. Appl. No. 18/530,656, dated Mar. 24, 2026.

U.S. Office Action for U.S. Appl. No. 18/531,326, dated Mar. 16, 2026.

U.S. Office Action for U.S. Appl. No. 18/532,081, dated Apr. 21, 2026.

U.S. Office Action for U.S. Appl. No. 18/532,350, dated Mar. 25, 2026.

U.S. Office Action for U.S. Appl. No. 18/532,495, dated Mar. 25, 2026.

* cited by examiner 42
4211

22

32
32a
34

1223
1224
12

42

4241

22

221 222

32

32a

1219

12

1218

CIRCUIT BOARD AND CONNECTOR ASSEMBLY WITH IMPROVED SHIELDING PERFORMANCE

CROSS-REFERENCE TO RELATED APPLICATION

This patent application claims priority of a Chinese Patent Application No. 202311286998.1, filed on Sep. 28, 2023 and titled "CIRCUIT BOARD AND CONNECTOR ASSEMBLY", the entire content of which is incorporated herein by reference.

TECHNICAL FIELD

The present disclosure relates to a circuit board and a connector assembly, which belongs to the technical field of connectors and surroundings.

BACKGROUND

A connector assembly in the related art generally include an electrical connector and a circuit board. The electrical connector is mounted to the circuit board. The circuit board is usually provided with a plurality of signal conductive areas (such as signal conductive pads) and a plurality of ground conductive areas (such as ground conductive pads). However, how to optimize the signal conductive area and the ground conductive area to improve shielding is a technical problem to be solved by those skilled in the art.

SUMMARY

An object of the present disclosure is to provide a circuit board and a connector assembly with improved shielding performance.

In order to achieve the above object, the present disclosure adopts the following technical solution: a circuit board, configured to mount an electrical connector, including: a plurality of first signal conductive areas; each of the first signal conductive areas extending along a first direction; a plurality of second signal conductive areas; each of the second signal conductive areas extending along the first direction; adjacent first signal conductive area and second signal conductive area being arranged side by side along a second direction to form a first signal conductive area group; the second direction being perpendicular to the first direction; a first ground conductive area, the first ground conductive area extending along the first direction; the first ground conductive area being located on one side of the first signal conductive area group along the second direction; and a second ground conductive area, the second ground conductive area extending along the first direction; the second ground conductive area being located on another side of the first signal conductive area group along the second direction; wherein along the second direction, two adjacent first signal conductive area groups are separated by the first ground conductive area or the second ground conductive area.

In order to achieve the above object, the present disclosure adopts the following technical solution: a connector assembly, including a circuit board and an electrical connector mounted on the circuit board; the electrical connector including: a housing, the housing defining a first terminal module installation slot; a first terminal module, the first terminal module being partially received in the first terminal module installation slot; the first terminal module including two first conductive terminals which are a first signal terminal and a second signal terminal, respectively; each first conductive terminal including a first mounting foot protruding beyond the housing; the first mounting foot of the first signal terminal and the first mounting foot of the second signal terminal being arranged side by side along a second direction; a first shielding rib, the first shielding rib being located on one side of the first mounting foot of the first signal terminal and the first mounting foot of the second signal terminal along the second direction; and a second shielding rib, the second shielding rib being located on another side of the first mounting foot of the first signal terminal and the first mounting foot of the second signal terminal along the second direction; the circuit board including: a plurality of first signal conductive pads; each of the first signal conductive pads extending along a first direction; the second direction being perpendicular to the first direction; a plurality of second signal conductive pads; each of the second signal conductive pads extending along the first direction; adjacent first signal conductive pad and second signal conductive pad being arranged side by side along the second direction to form a first signal conductive pad group; a first ground conductive pad, the first ground conductive pad extending along the first direction; the first ground conductive pad being located on one side of the first signal conductive pad group along the second direction; and a second ground conductive pad, the second ground conductive pad extending along the first direction; the second ground conductive pad being located on another side of the first signal conductive pad group along the second direction; wherein along the second direction, two adjacent first signal conductive pad groups are separated by the first ground conductive pad or the second ground conductive pad; a length of the first ground conductive pad along the first direction is greater than a length of the first signal conductive pad along the first direction, and is also greater than a length of the second signal conductive pad along the first direction; a length of the second ground conductive pad along the first direction is greater than the length of the first signal conductive pad along the first direction, and is also greater than the length of the second signal conductive pad along the first direction; wherein the first mounting foot of the first signal terminal is electrically connected to the first signal conductive pad; the first mounting foot of the second signal terminal is electrically connected to the second signal conductive pad; the first shielding rib is electrically connected to the first ground conductive pad; and the second shielding rib is electrically connected to the second ground conductive pad.

Compared with the prior art, along the second direction, two adjacent first signal conductive area groups are separated by the first ground conductive area or the second ground conductive area, which is beneficial to improving the shielding effect.

DETAILED DESCRIPTION

Figure 1:
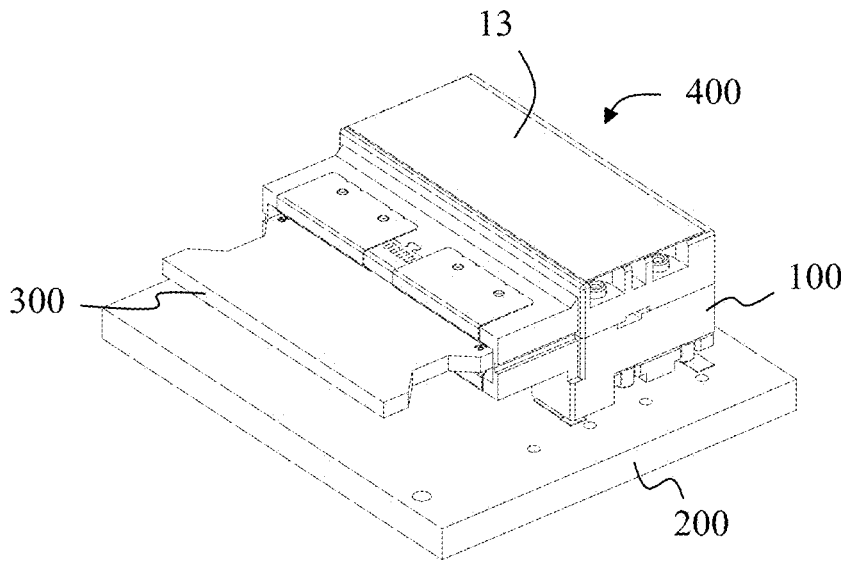
FIG. 1 is a perspective schematic view of a connector assembly in accordance with an embodiment of the present disclosure.
Figure 2:
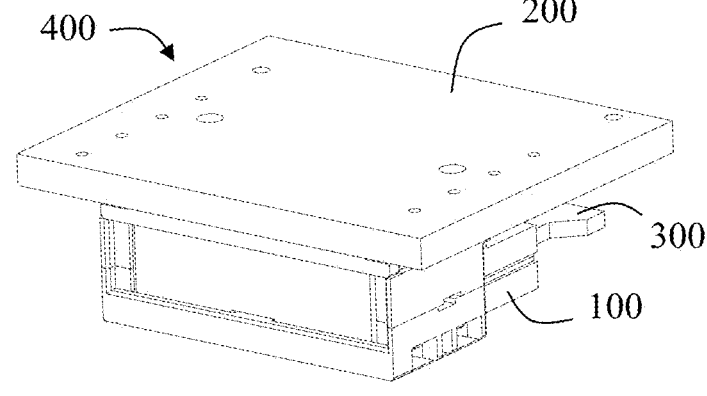
FIG. 2 is a perspective view of FIG. 1 from another angle.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Referring to FIG. 1 to FIG. 4, the present disclosure discloses a connector assembly 400 including an electrical connector 100, a circuit board 200 for mounting the electrical connector 100, and a mating module 300 configured to be at least partially inserted into the electrical connector 100. In the illustrated embodiment of the present disclosure, the electrical connector 100 is an OSFP (Octal Small Form-factor Pluggable) receptacle connector. Correspondingly, the mating module 300 is an OSFP plug connector. Of course, it is understandable to those skilled in the art that the electrical connector 100 can also be an SFP (Small Form-factor Pluggable) receptacle connector, a QSFP (Quad Small Form-factor Pluggable) receptacle connector, a QSFP-DD (Quad Small Form-factor Pluggable-Double Density) receptacle connector, an SFP-DD (Small Form-factor Pluggable-Double Density) receptacle connector or a DSFP (Dual Chanel Small Form-factor Pluggable) receptacle connector, etc. Correspondingly, the mating module 300 is an SFP plug connector, a QSFP plug connector, a QSFP-DD plug connector, an SFP-DD plug connector or a DSFP plug connector, etc. It is understandable to those skilled in the art that the basic structure of the above types of the electrical connectors is regulated by corresponding association standards, and will not be described in detail here.

Figure 3:
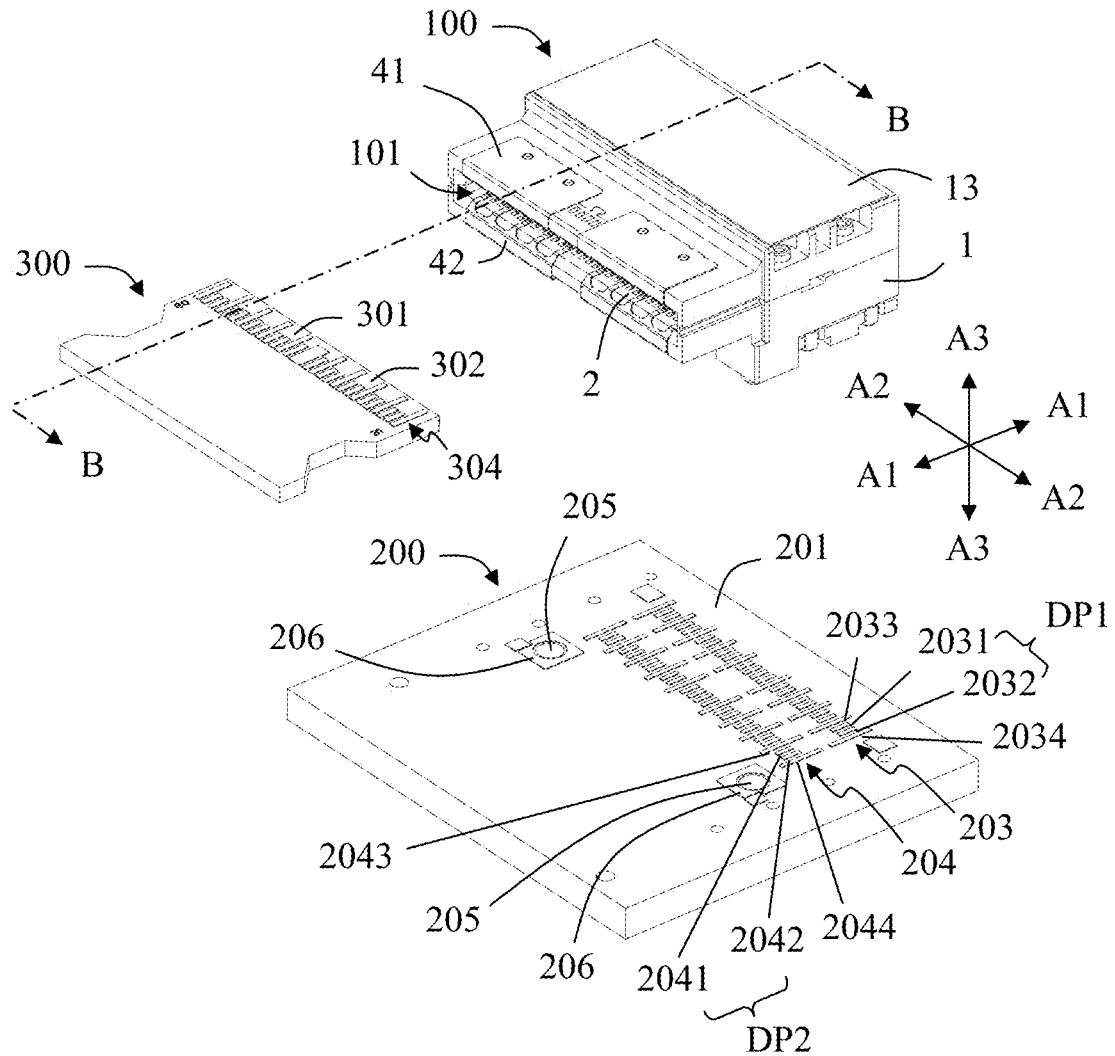
FIG. 3 is a partially exploded perspective view of FIG. 1.

Referring to FIG. 3, in the illustrated embodiment of the present disclosure, the electrical connector 100 defines a receiving slot 101 for at least partially receiving the mating module 300. To simplify the description of the specific embodiments of the present disclosure, an insertion and extraction direction of the mating module 300 and the electrical connector 100 is a first direction A1-A1 (for example, a front-rear direction); a width direction of the receiving slot 101 is a second direction A2-A2 (for example, a left-right direction); an installation direction of the electrical connector 100 and the circuit board 200 is a third direction A3-A3 (for example, a top-bottom direction). Each two of the first direction A1-A1, the second direction A2-A2 and the third direction A3-A3 are perpendicular to each other.

As shown in FIGS. 3 to 6, the mating module 300 includes a tongue plate 301. The tongue plate 301 includes a tongue plate upper surface 302, a tongue plate lower surface 303, a plurality of first contact pads 304 exposed to the tongue plate upper surface 302, and a plurality of second contact pads 305 exposed to the tongue plate lower surface 303. The plurality of first contact pads 304 are disposed at intervals along the second direction A2-A2. The plurality of second contact pads 305 are disposed at intervals along the second direction A2-A2.

Figure 6:
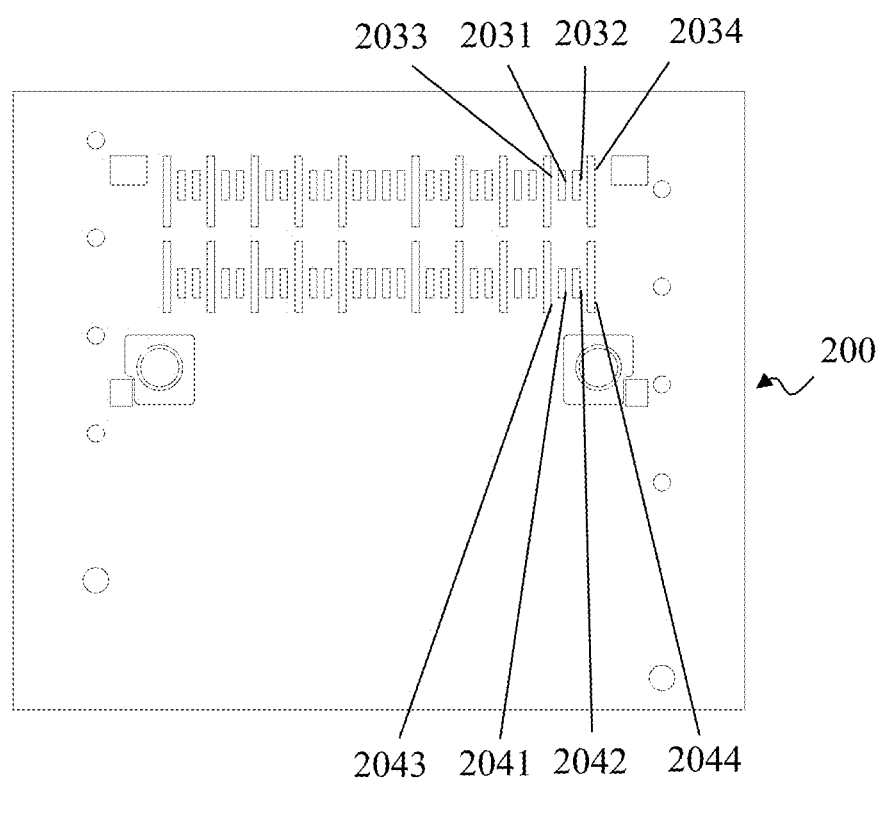
FIG. 6 is a top view of an electrical connector, a mating module and a circuit board in accordance with an embodiment of the present disclosure.
Figure 6:
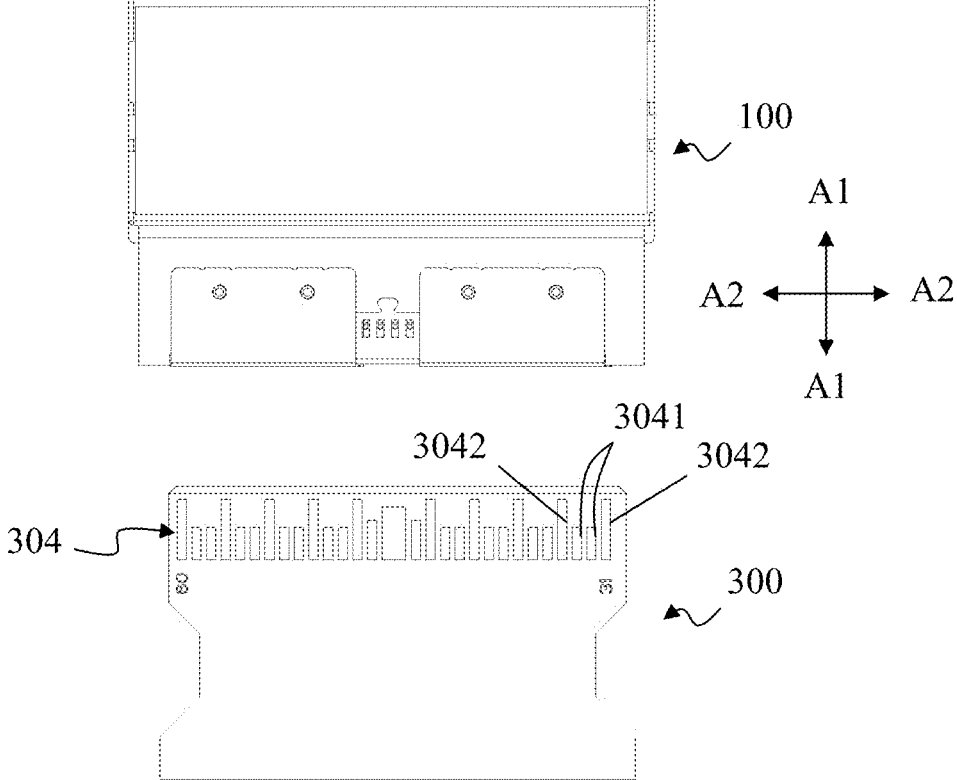

Specifically, as shown in FIG. 6, in the illustrated embodiment of the present disclosure, the plurality of first contact pads 304 include a plurality of first signal contact pads 3041 and a plurality of first ground contact pads 3042. The plurality of first signal contact pads 3041 are divided into a plurality of groups, in which each group includes two first signal contact pads 3041 adjacently arranged along the second direction A2-A2. Each group of first signal contact pads 3041 is associated with two first ground contact pads 3042 which are located on two sides thereof respectively, so as to improve shielding and improve signal transmission quality. In the illustrated embodiment of the present disclosure, each group of first signal contact pads 3041 forms a differential pair to increase the speed of signal transmission. In the illustrated embodiment of the present disclosure, a length of each first ground contact pad 3042 along the first direction A1-A1 is greater than a length of each first signal contact pad 3041 along the first direction A1-A1, so as to better improve the shielding and improve the signal transmission quality.

Figure 7:
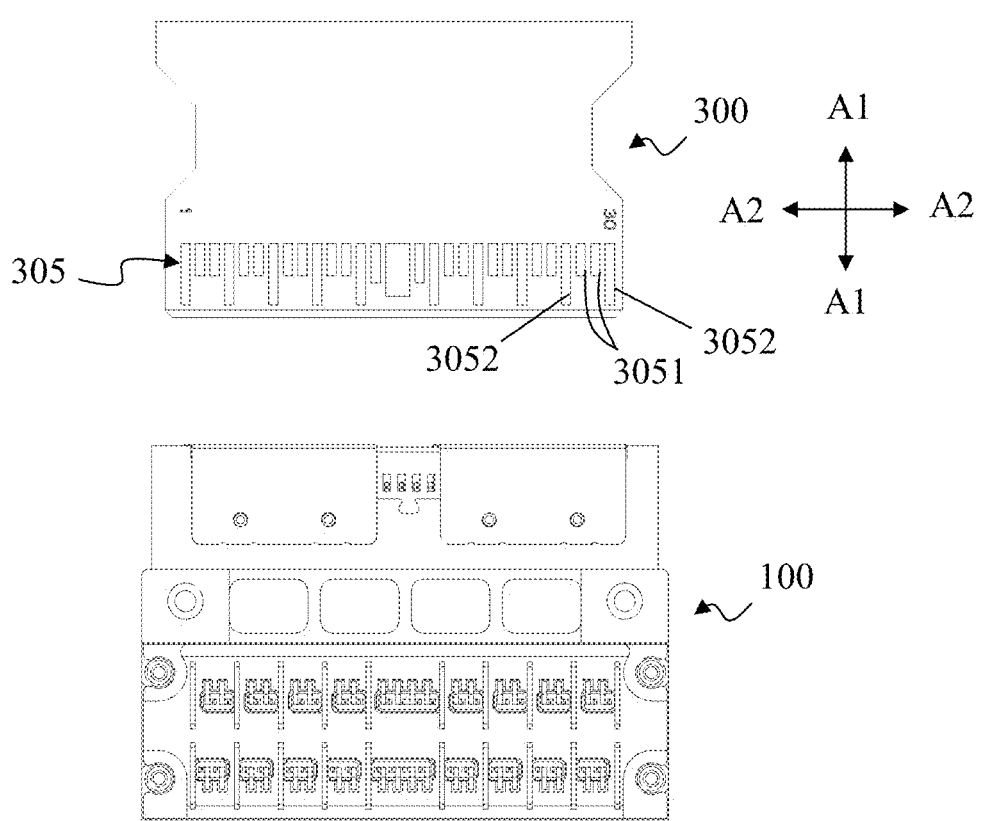
FIG. 7 is a bottom view of FIG. 6.
Figure 7:
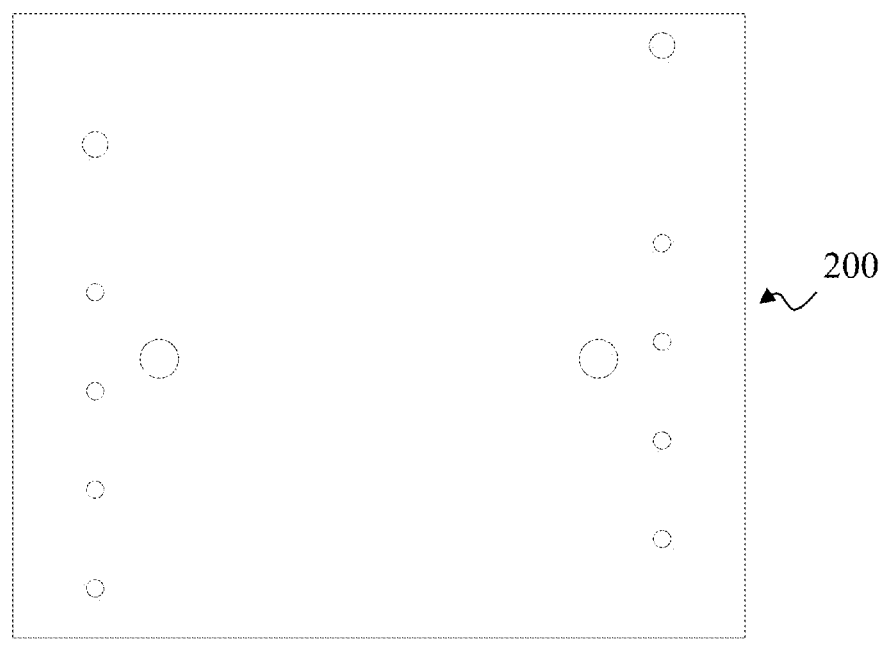
Figure 8:
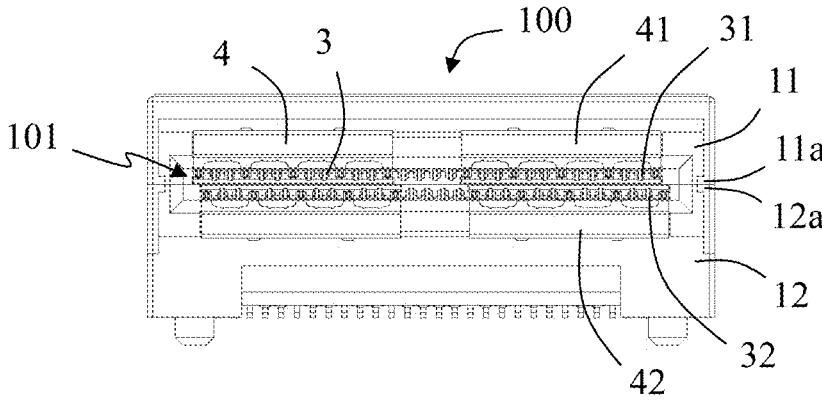
FIG. 8 is a front view of the electrical connector in accordance with an embodiment of the present disclosure.
Figure 9:
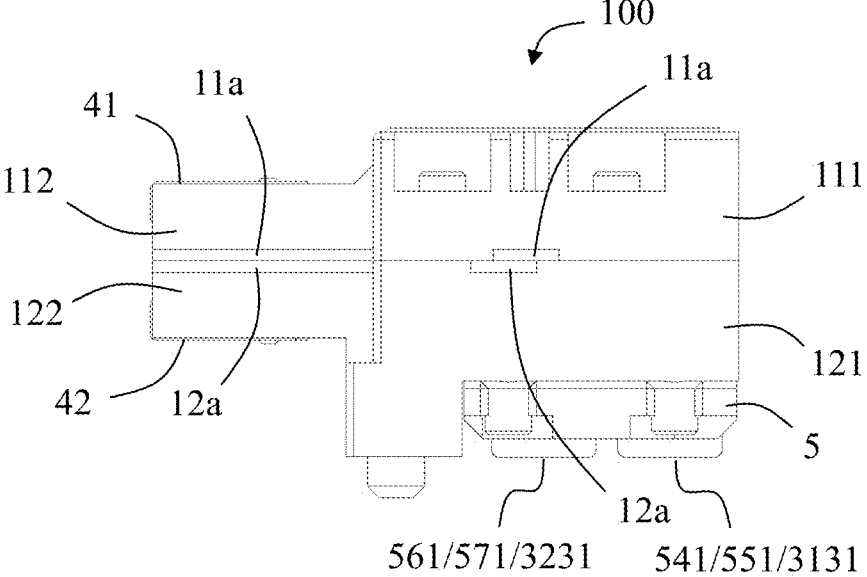
FIG. 9 is a right view of FIG. 8.

Referring to FIG. 7, similarly, in the illustrated embodiment of the present disclosure, the plurality of second contact pads 305 include a plurality of second signal contact pads 3051 and a plurality of second ground contact pads 3052. The plurality of second signal contact pads 3051 are divided into a plurality of groups, in which each group includes two second signal contact pads 3051 adjacently arranged along the second direction A2-A2. Each group of second signal contact pads 3051 is associated with two second ground contact pads 3052 which are located on two sides thereof respectively, so as to improve shielding and improve signal transmission quality. In the illustrated embodiment of the present disclosure, each group of second signal contact pads 3051 forms a differential pair to increase the speed of signal transmission. In the illustrated embodiment of the present disclosure, a length of each second ground contact pad 3052 along the first direction A1-A1 is greater than a length of each second signal contact pad 3051 along the first direction A1-A1, so as to better improve the shielding and improve the signal transmission quality.

Figure 4:
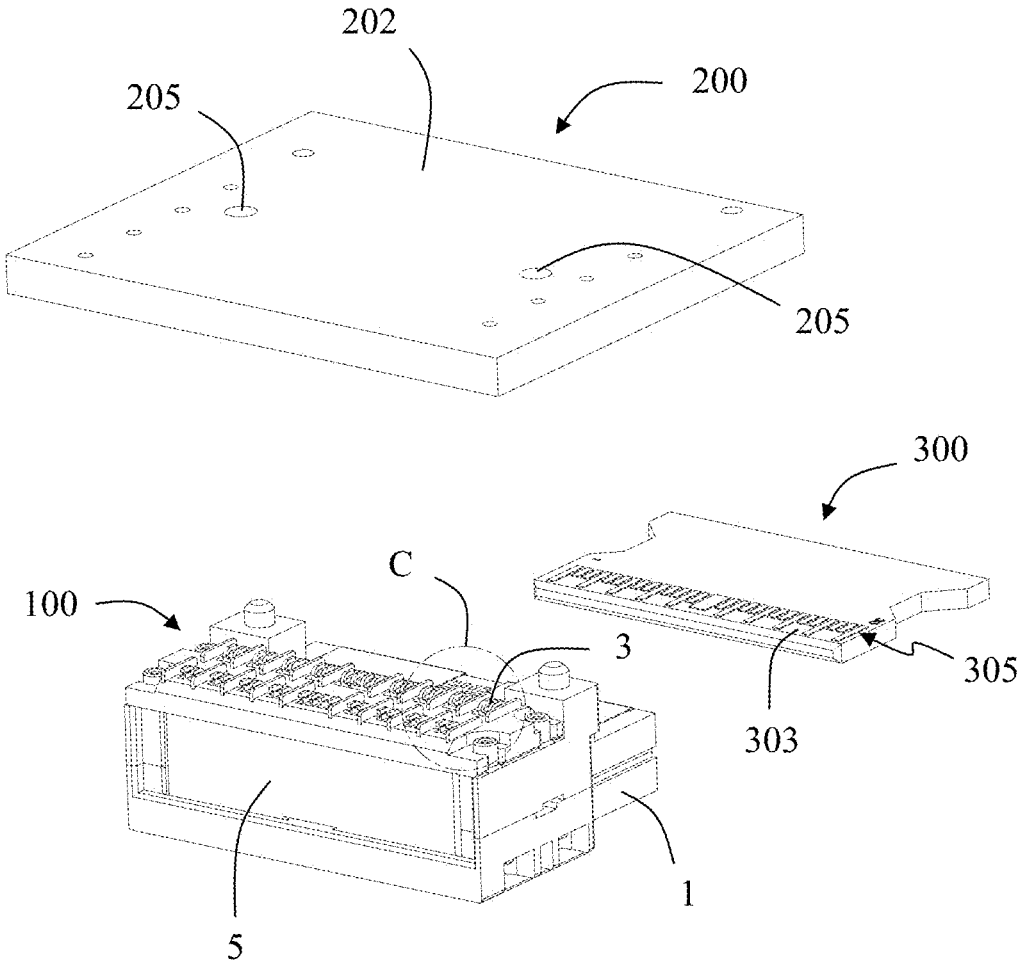
FIG. 4 is a partially exploded perspective view of FIG. 3 from another angle.

Referring to FIG. 3 and FIG. 4, in one embodiment of the present disclosure, the circuit board 200 includes a circuit board upper surface 201, a circuit board lower surface 202, a plurality of first conductive areas and a plurality of second conductive areas. The plurality of first conductive areas include a plurality of first signal conductive areas, a plurality of second signal conductive areas, a plurality of first ground conductive areas and a plurality of second ground conductive areas. Adjacent first signal conductive area and second signal conductive area along the second direction A2-A2 form a first signal conductive area group. In an embodiment of the present disclosure, the first signal conductive area group is a differential pair to increase the speed of signal transmission. Along the second direction A2-A2, each first signal conductive area group associated with one first ground conductive area and one second ground conductive area which are located on two sides thereof respectively, so as to improve the shielding and improve the signal transmission quality.

In one embodiment of the present disclosure, the plurality of first conductive areas are a plurality of first conductive pads 203; and the plurality of second conductive areas are a plurality of second conductive pads 204. The plurality of first conductive pads 203 and the plurality of second conductive pads 204 are configured to be electrically connected to corresponding conductive terminals of the electrical connector 100 by surface mounted technology (SMT). The plurality of first conductive pads 203 are exposed to the circuit board upper surface 201 and are disposed at intervals along the second direction A2-A2. The plurality of second conductive pads 204 are exposed to the circuit board upper surface 201 and are disposed at intervals along the second direction A2-A2. The plurality of first conductive pads 203 and the plurality of second conductive pads 204 are generally disposed in two rows along the first direction A1-A1.

The plurality of first conductive pads 203 include a plurality of first signal conductive pads 2031, a plurality of second signal conductive pads 2032, a plurality of first ground conductive pads 2033, and a plurality of second ground conductive pads 2034. Adjacent first signal conductive pad 2031 and second signal conductive pad 2032 adjacent along the second direction A2-A2 form a first signal conductive pad group DP1. In an embodiment of the present disclosure, the first signal conductive pad group DP1 is a differential pair to increase the speed of signal transmission. Along the second direction A2-A2, each first signal conductive pad group DP1 is associated with one first ground conductive pad 2033 and one second ground conductive pad 2034 which are located on two sides thereof, respectively, so as to improve shielding and improve signal transmission quality. In the illustrated embodiment of the present disclosure, a length of each first ground conductive pad 2033 along the first direction A1-A1 is greater than a length of each first signal conductive pad 2031 along the first direction A1-A1, and is also greater than a length of each second signal conductive pad 2032 along the first direction A1-A1, thereby better improving the shielding and improving the signal transmission quality. A length of each second ground conductive pad 2034 along the first direction A1-A1 is greater than the length of each first signal conductive pad 2031 along the first direction A1-A1, and is also greater than the length of each second signal conductive pad 2032 along the first direction A1-A1, thereby better improving the shielding and improving the signal transmission quality.

Referring to FIG. 3 and FIG. 6, in the illustrated embodiment of the present disclosure, the first signal conductive pad 2031 and the second signal conductive pad 2032 in each first signal conductive pad group DP1 are the same, and are aligned along the second direction A2-A2. In other words, a front edge of the first signal conductive pad 2031 is aligned with a front edge of the second signal conductive pad 2032. A rear edge of the first signal conductive pad 2031 is aligned with a rear edge of the second signal conductive pad 2032. A front edge of the first ground conductive pad 2033 extends forwardly and protrudes beyond the front edge of the first signal conductive pad 2031 and the front edge of the second signal conductive pad 2032. A rear edge of the first ground conductive pad 2033 extends backwardly and protrudes beyond the rear edge of the first signal conductive pad 2031 and the rear edge of the second signal conductive pad 2032. A front edge of the second ground conductive pad 2034 extends forwardly and protrudes beyond the front edge of the first signal conductive pad 2031 and the front edge of the second signal conductive pad 2032. A rear edge of the second ground conductive pad 2034 extends backwardly and protrudes beyond the rear edge of the first signal conductive pad 2031 and the rear edge of the second signal conductive pad 2032. With this arrangement, the first ground conductive pad 2033 and the second ground conductive pad 2034 can achieve shielding coverage of the first signal conductive pad 2031 and the second signal conductive pad 2032 over their entire lengths, thereby improving the shielding and improving the signal transmission quality.

Referring to FIG. 3 and FIG. 6, in the illustrated embodiment of the present disclosure, the plurality of second conductive pads 204 include a plurality of third signal conductive pads 2041, a plurality of fourth signal conductive pads 2042, a plurality of third ground conductive pads 2043 and a plurality of fourth ground conductive pads 2044. Adjacent third signal conductive pad 2041 and the fourth signal conductive pad 2042 along the second direction A2-A2 form a second signal conductive pad group DP2. In an embodiment of the present disclosure, the second signal conductive pad group DP2 is a differential pair to increase the speed of signal transmission. Along the second direction A2-A2, each second signal conductive pad group DP2 is associated with one third ground conductive pad 2043 and one fourth ground conductive pad 2044 which are located on two sides thereof respectively, so as to improve shielding and improve signal transmission quality. In the illustrated embodiment of the present disclosure, a length of each third ground conductive pad 2043 along the first direction A1-A1 is greater than a length of each third signal conductive pad 2041 along the first direction A1-A1, and is also greater than a length of each fourth signal conductive pad 2042 along the first direction A1-A1, thereby better improving the shielding and improving the signal transmission quality. A length of each fourth ground conductive pad 2044 along the first direction A1-A1 is greater than the length of each third signal conductive pad 2041 along the first direction A1-A1, and is also greater than the length of each fourth signal conductive pad 2042 along the first direction A1-A1, thereby better improving the shielding and improving the signal transmission quality.

Referring to FIG. 3 and FIG. 6, in the illustrated embodiment of the present disclosure, the third signal conductive pad 2041 and the fourth signal conductive pad 2042 in each second signal conductive pad group DP2 are the same, and are aligned along the second direction A2-A2. In other words, a front edge of the third signal conductive pad 2041 is aligned with a front edge of the fourth signal conductive pad 2042. A rear edge of the third signal conductive pad 2041 is aligned with a rear edge of the fourth signal conductive pad 2042. A front edge of the third ground conductive pad 2043 extends forwardly and protrudes beyond a front edge of the third signal conductive pad 2041 and a front edge of the fourth signal conductive pad 2042. A rear edge of the third ground conductive pad 2043 extends backwardly and protrudes beyond a rear edge of the third signal conductive pad 2041 and a rear edge of the fourth signal conductive pad 2042. A front edge of the fourth ground conductive pad 2044 extends forwardly and protrudes beyond the front edge of the third signal conductive pad 2041 and the front edge of the fourth signal conductive pad 2042. A rear edge of the fourth ground conductive pad 2044 extends backwardly and protrudes beyond the rear edge of the third signal conductive pad 2041 and the rear edge of the fourth signal conductive pad 2042.

With this arrangement, the third ground conductive pad 2043 and the fourth ground conductive pad 2044 can achieve shielding coverage of the third signal conductive pad 2041 and the fourth signal conductive pad 2042 over their entire lengths, thereby improving the shielding and improving the signal transmission quality.

In another embodiment of the present disclosure, the plurality of first conductive areas are a plurality of first through holes; and the plurality of second conductive areas are a plurality of second through holes. In other words, the first conductive pads 203 and the second conductive pads 204 of the circuit board 200 in the first embodiment are replaced by the first through holes and the second through holes. The plurality of first through holes and the plurality of second through holes extend through the circuit board upper surface 201 and the circuit board lower surface 202 along the third direction A3-A3. The plurality of first through holes and the plurality of second through holes are configured to allow corresponding conductive terminals of the electrical connector 100 to be at least partially inserted to achieve electrical connection. In one embodiment, the corresponding conductive terminals of the electrical connector 100 extend through the first through holes and the second through holes, and are electrically connected to the circuit board 200 by through hole welding or soldering. At this time, the first signal conductive pad 2031 is replaced by a first signal through hole; the second signal conductive pad 2032 is replaced by a second signal through hole; the first ground conductive pad 2033 is replaced by a first ground through hole; and the second ground conductive pad 2034 is replaced by a second ground through hole.

In another embodiment, the first through holes and the second through holes are first conductive through holes and second conductive through holes, respectively. That is, the first signal conductive pad 2031 is replaced by a first signal conductive through hole; the second signal conductive pad 2032 is replaced by a second signal conductive through hole; the first ground conductive pad 2033 is replaced by a first ground conductive through hole; and the second ground conductive pad 2034 is replaced by a second ground conductive through hole. The corresponding conductive terminals of the electrical connector 100 are at least partially pressed into the first conductive through holes and the second conductive through holes, and the electrical connection between the conductive terminals and the conductive through holes is achieved by press-fitting.

Referring to FIG. 3 and FIG. 4, in the illustrated embodiment of the present disclosure, the circuit board 200 further includes a plurality of mounting through holes 205 extending through the circuit board upper surface 201 and the circuit board lower surface 202, and a plurality of ground fixing pads 206 exposed to the circuit board upper surface 201. The ground fixing pads 206 are disposed around corresponding mounting through holes 205. The mounting through holes 205 are configured to position the electrical connector 100. The ground fixing pads 206 are configured to contact the electrical connector 100 so to better achieve grounding and/or fixation. In one embodiment of the present disclosure, the ground fixing pads 206 are welded or soldered to corresponding parts of the electrical connector 100, thereby achieving the grounding function, and increasing the bonding force between the electrical connector 100 and the circuit board 200. In one embodiment of the present disclosure, the plurality of ground fixing pads 206 are connected as a whole through internal conductive traces of the circuit board 200 to increase the grounding area.

Referring to FIGS. 8 to 12, in one embodiment of the present disclosure, the electrical connector 100 includes a housing, an insulating fixing block 2 fixed to the housing, and a plurality of conductive terminals 3 installed to the housing.

In an embodiment of the present disclosure, the housing is a conductive housing 1. The conductive housing 1 is a metal housing made of metal material so as to further improve the shielding effect and improve the quality of signal transmission. In another embodiment of the present disclosure, the conductive housing 1 may also be a composite housing formed by electroplating a metal material on an insulating material. The composite housing can also improve the shielding effect and improve the quality of signal transmission.

Figure 10:
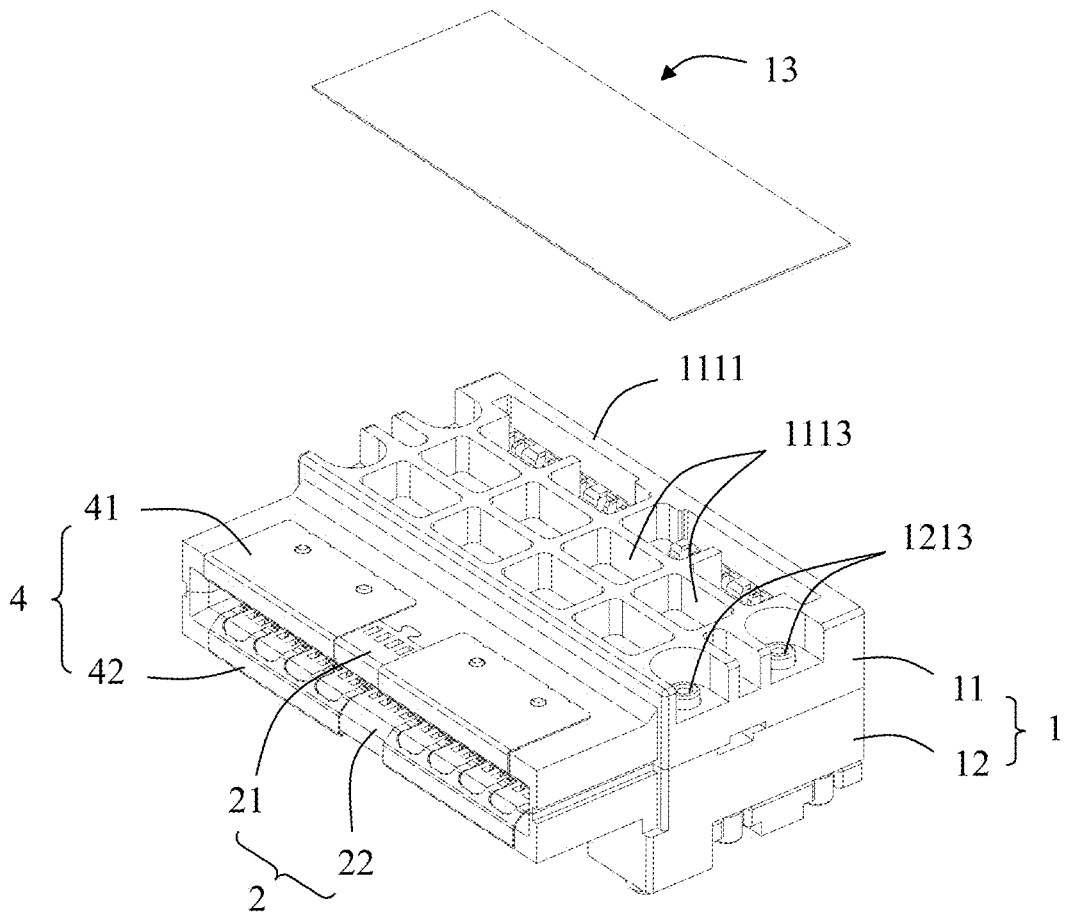
FIG. 10 is a partially exploded perspective view of the electrical connector shown in FIG. 3.

As shown in FIG. 10, in an embodiment of the present disclosure, the conductive housing 1 includes a first conductive housing 11 and a second conductive housing 12. The first conductive housing 11 and the second conductive housing 12 are fixed together. For example, after the first conductive housing 11 and the second conductive housing 12 are assembled, they are fixed together by welding or soldering or other methods.

Referring to FIG. 16, FIG. 17, FIG. 22 and FIG. 23, in an embodiment of the present disclosure, the first conductive housing 11 includes a first base portion 111 and a first protruding portion 112 extending forwardly from the first base portion 111. The first base portion 111 includes a first upper surface 1111, a first lower surface 1112, and at least one weight-reducing groove 1113 recessed downwardly from the first upper surface 1111. Weight reduction can be achieved by providing the weight reduction groove 1113. In the illustrated embodiment of the present disclosure, a plurality of weight-reducing grooves 1113 are provided and do not extend downwardly through the first base portion 111, thereby reducing weight while ensuring the shielding performance of the first base portion 111. The first base portion 111 further defines a plurality of first positioning through holes 1114 located on two sides of the first base portion 111 and extending through the first base portion 111 along the third direction A3-A3. In addition, the first base portion 111 further includes a first rear surface 1115 and a first mounting groove 1116 recessed forwardly from the first rear surface 1115. The first mounting groove 1116 extends downwardly through the first lower surface 1112. The first base portion 111 further includes at least one first mounting slot 1117 communicating with the first mounting groove 1116. In the illustrated embodiment of the present disclosure, two first mounting slots 1117 are provided, and penetrate downwardly through the first lower surface 1112. The first mounting slots 1117 communicate with the first mounting groove 1116. A bottom of the first base portion 111 further includes at least one first recess 1118 adjacent to the first protruding portion 112. In the illustrated embodiment of the present disclosure, two first recesses 1118 are provided. The first base portion 111 further includes a plurality of first mounting protrusions 1119 protruding into corresponding first recesses 1118.

The first protruding portion 112 includes a second upper surface 1121, a second lower surface 1122, and a plurality of first filling grooves 1123 extending upwardly through the second upper surface 1121 along the third direction A3-A3. The first filling grooves 1123 extend forwardly through a first front end surface 1120 of the first protruding portion 112 along the first direction A1-A1. The first protruding portion 112 further includes a plurality of first positioning posts 1124 protruding upwardly beyond the second upper surface 1121 along the third direction A3-A3.

Figure 23:
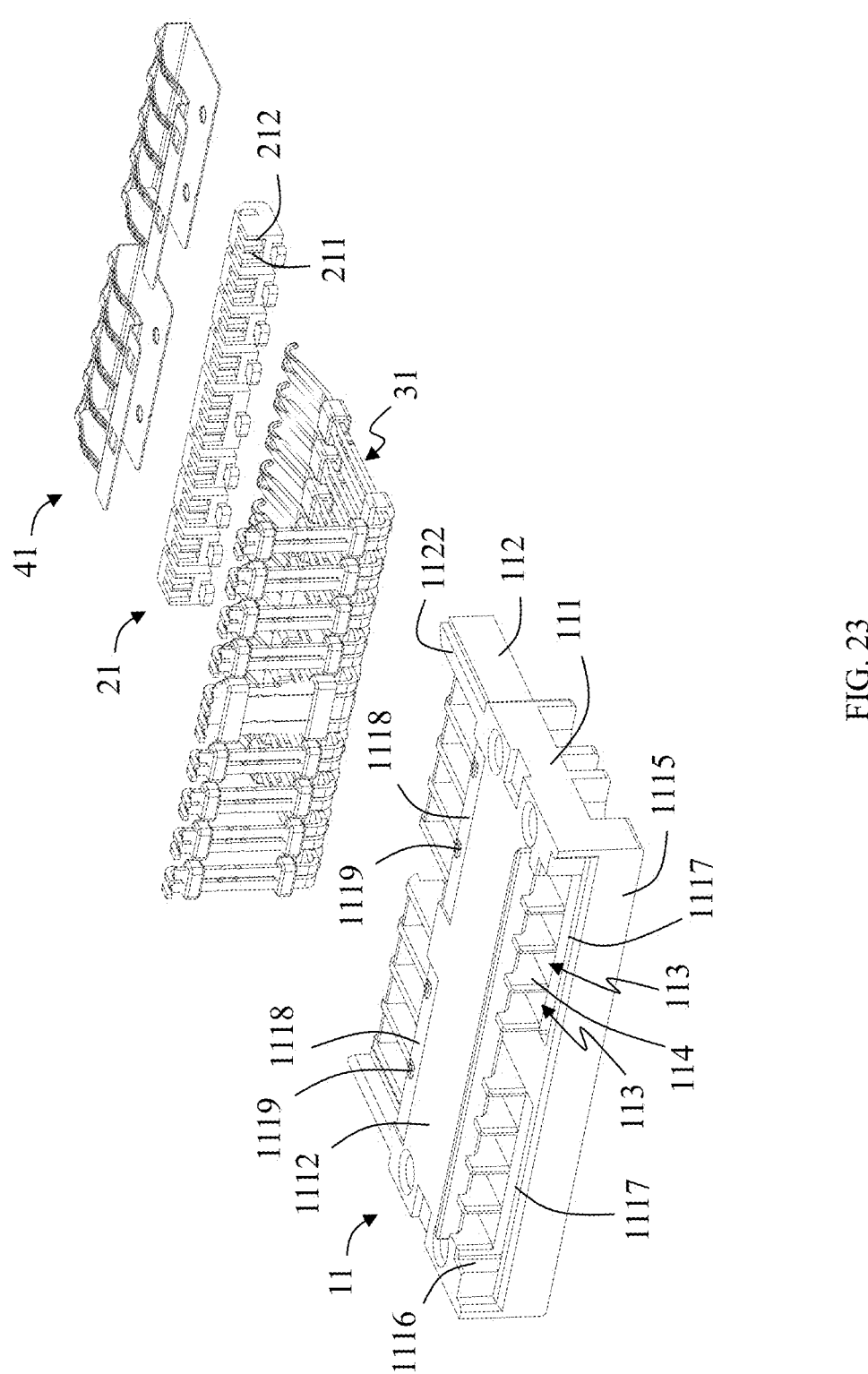
FIG. 23 is an exploded perspective view of FIG. 22 from another angle.
Figure 24:
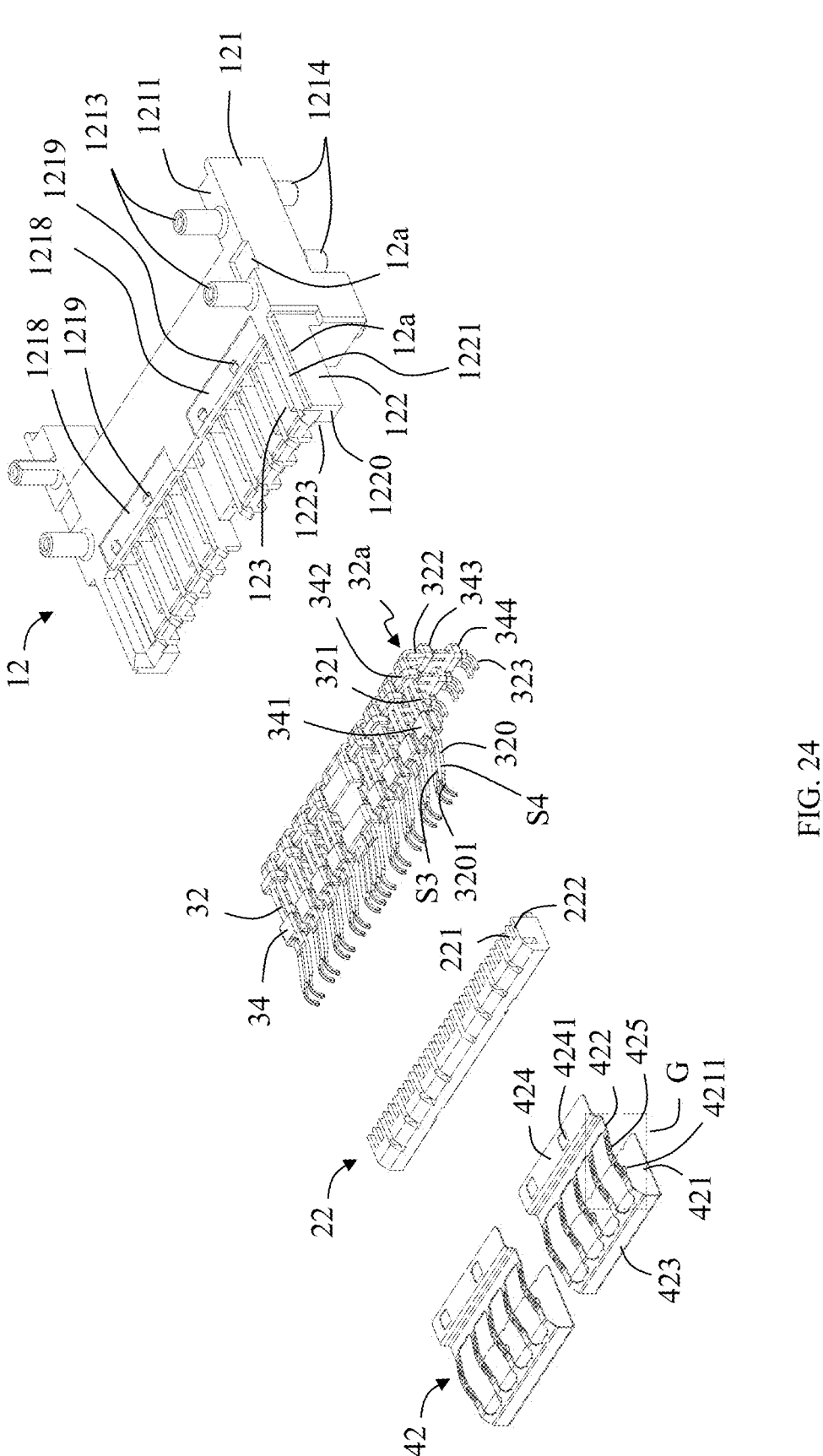
FIG. 24 is an exploded perspective view of the second conductive housing, a plurality of second terminal modules, a second insulating fixing block and a second ground sheet in FIG. 16.

Referring to FIG. 23, in the illustrated embodiment of the present disclosure, the first conductive housing 11 further includes a plurality of first terminal module installation slots 113 extending along the first direction A1-A1. Each first terminal module installation slot 113 extends from the first base portion 111 to the first protruding portion 112. A rear end of the first terminal module installation slot 113 communicates with the first mounting groove 1116. A middle portion of the first terminal module installation slot 113 is circumferentially surrounded by walls of the first conductive housing 11. A front end of the first terminal module installation slot 113 extends downwardly through the second lower surface 1122. It is understandable to those skilled in the art that by arranging the middle portion of the first terminal module installation slot 113 to be surrounded by the walls of the first conductive housing 11 in a circumferential direction, on the one hand, the conductive terminals located in the first terminal module installation slots 113 can be better shielded; and on the other hand, adjacent first terminal module installation slots 113 can be well separated, thereby reducing signal crosstalk.

As shown in FIG. 23, the plurality of first terminal module installation slots 113 are spaced apart along the second direction A2-A2. The first conductive housing 11 includes a plurality of first partition walls 114 disposed at intervals along the second direction A2-A2. Two adjacent first terminal module installation slots 113 are separated by a corresponding first partition wall 114 along the second direction A2-A2. In other words, each first terminal module installation slot 113 is surrounded by four walls of the first conductive housing 11 on a length corresponding to the corresponding first partition wall 114, thereby improving the shielding effect. With this arrangement, each first terminal module installation slot 113 is relatively independent, thereby reducing signal crosstalk and improving the quality of data transmission.

Referring to FIG. 16, FIG. 17, FIG. 24 and FIG. 25, in an embodiment of the present disclosure, the second conductive housing 12 includes a second base portion 121 and a second protruding portion 122 extending forwardly from the second base portion 121. The second base portion 121 includes a third upper surface 1211, a third lower surface 1212, a plurality of first mounting posts 1213 protruding upwardly beyond the third upper surface 1211, and a plurality of second mounting posts 1214 protruding downwardly beyond the third lower surface 1212. In addition, the second base portion 121 includes a second rear surface 1215 and a receiving space 1216 recessed forwardly from the second rear surface 1215. The receiving space 1216 extends through the second base portion 121 along the third direction A3-A3. In addition, the second base portion 121 further defines a second mounting groove 1217. A top of the second base portion 121 further defines at least one second recess 1218 adjacent to the second protruding portion 122. In the illustrated embodiment of the present disclosure, two second recesses 1218 are provided. The second base portion 121 further includes a plurality of second mounting protrusions 1219 protruding into corresponding second recesses 1218. The second conductive housing 12 further includes a plurality of mounting posts 1214a protruding downwardly beyond the second mounting posts 1214. The mounting posts 1214a are used to be inserted into the mounting through holes 205 of the circuit board 200 so as to achieve installation positioning. In one embodiment of the present disclosure, a bottom wall of the second conductive housing 12 and the ground fixing pad 206 are fixed by welding or soldering.

The second protruding portion 122 includes a fourth upper surface 1221, a fourth lower surface 1222, and a plurality of second filling grooves 1223 extending downwardly through the fourth lower surface 1222. The second filling grooves 1223 extend forwardly through a second front end surface 1220 of the second protruding portion 122. The second protruding portion 122 further includes a plurality of second positioning posts 1224 protruding downwardly beyond the second lower surface 1122.

Figure 25:
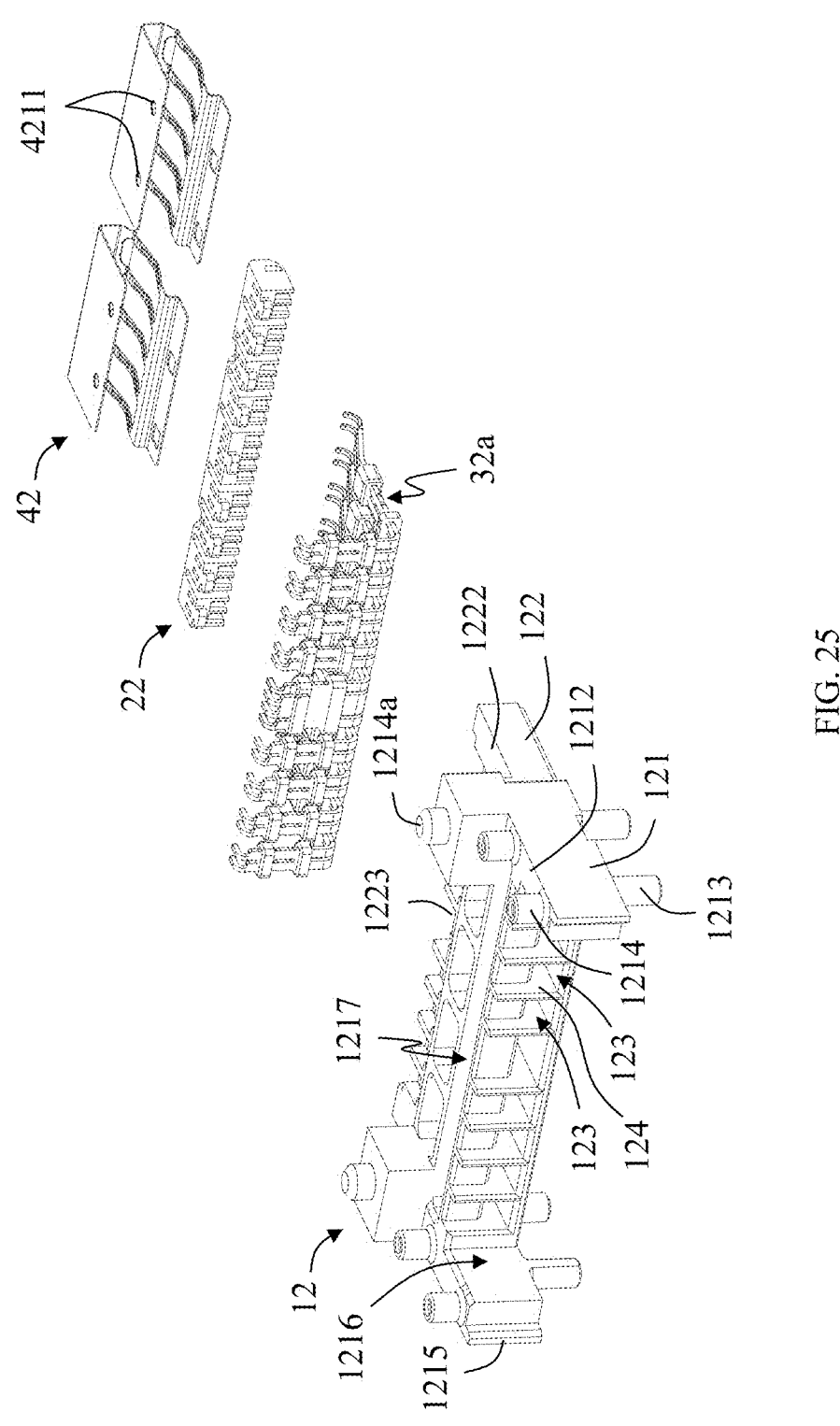
FIG. 25 is an exploded perspective view of FIG. 24 from another angle.
Figure 26:
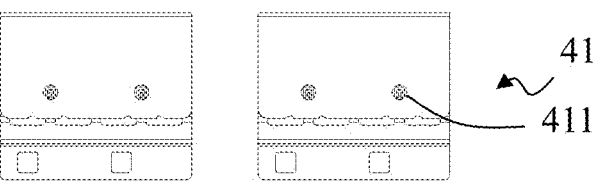
FIG. 26 is a top view of FIG. 22 from a certain angle.
Figure 26:
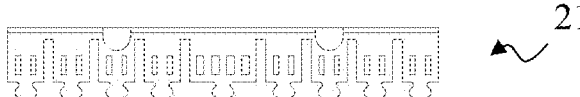
Figure 26:
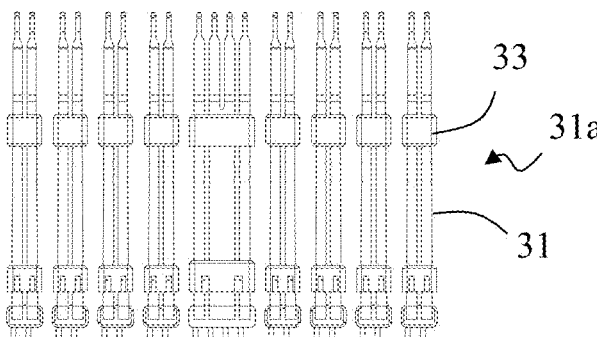
Figure 26:
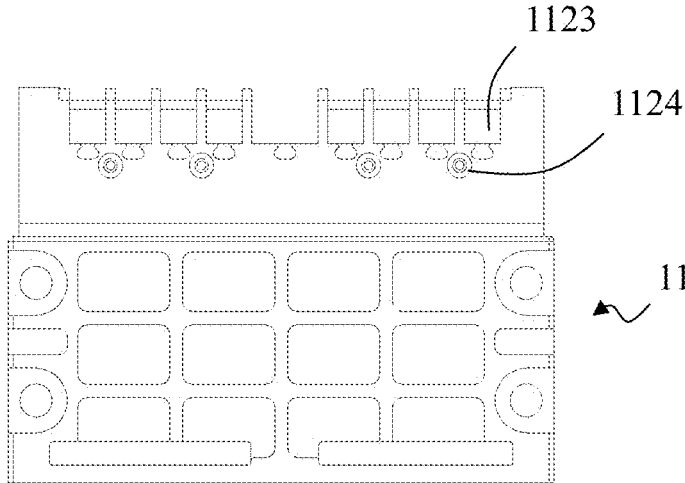
Figure 27:
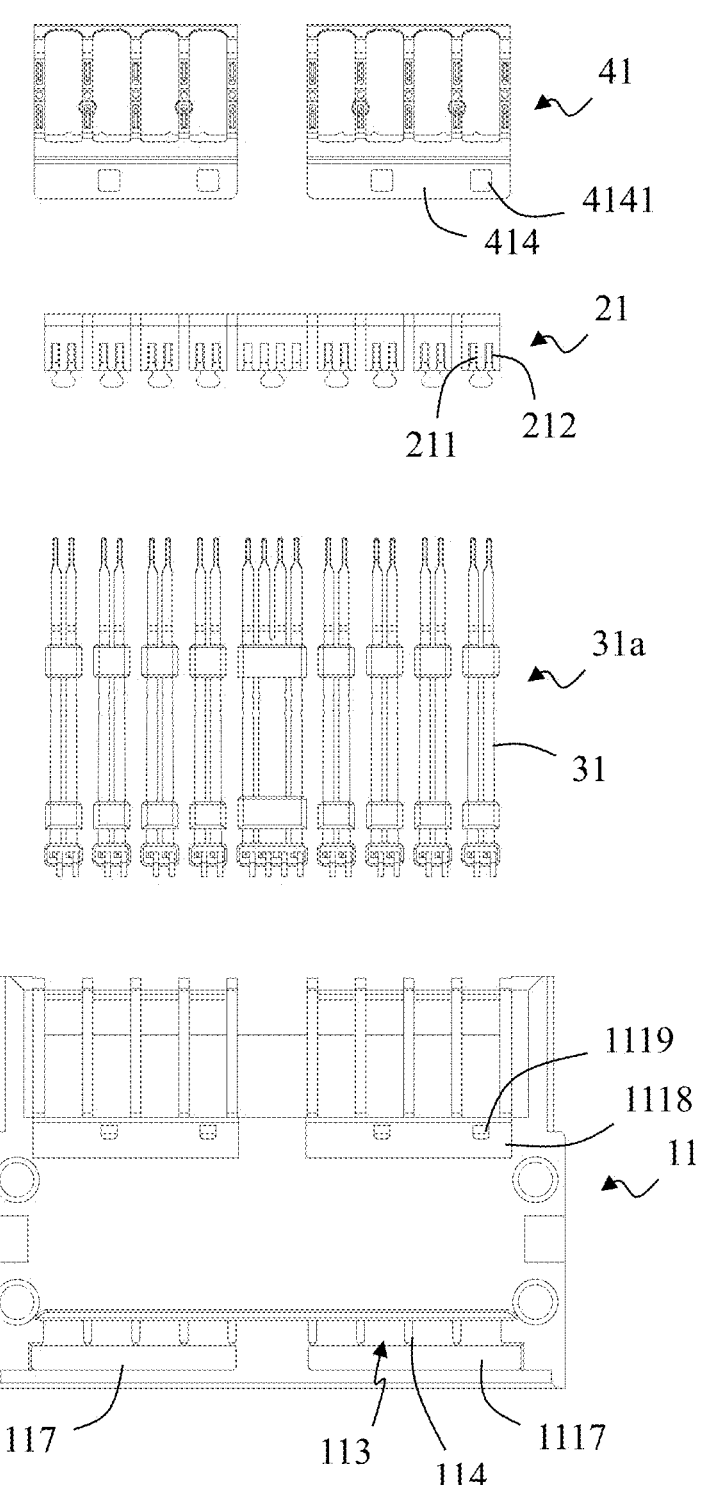
FIG. 27 is a top view of FIG. 23.
Figure 28:
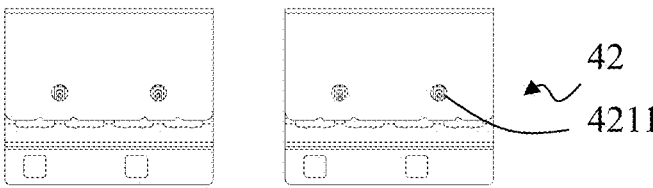
FIG. 28 is a top view of FIG. 25.
Figure 28:
Figure 28:
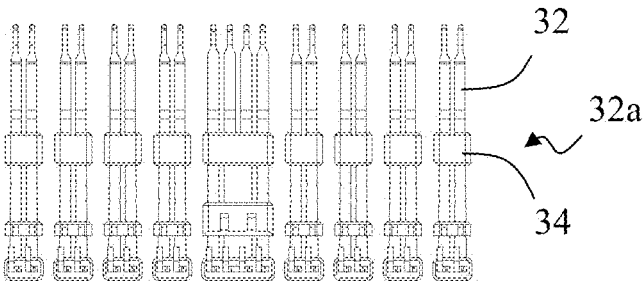
Figure 28:
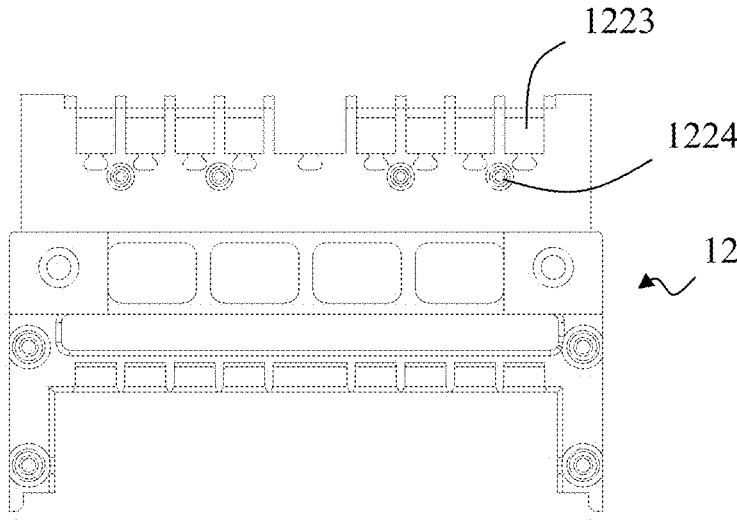
Figure 29:
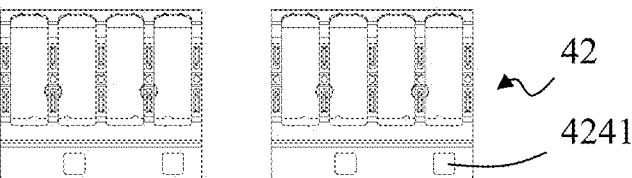
FIG. 29 is a top view of FIG. 24 from a certain angle.
Figure 29:
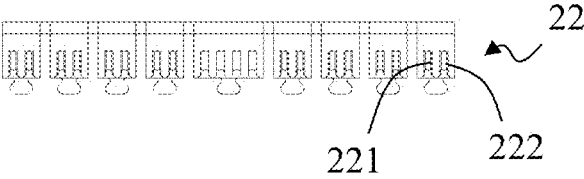
Figure 29:
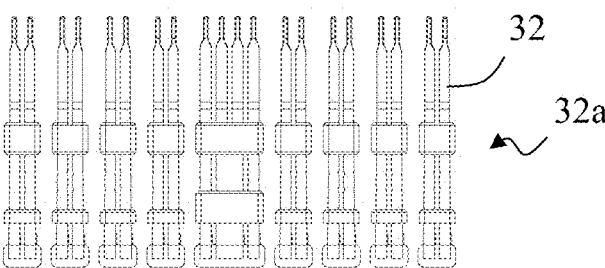
Figure 29:
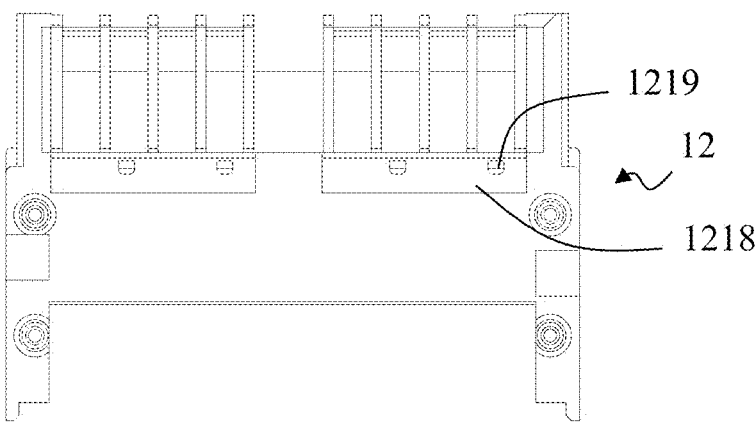
Figure 30:
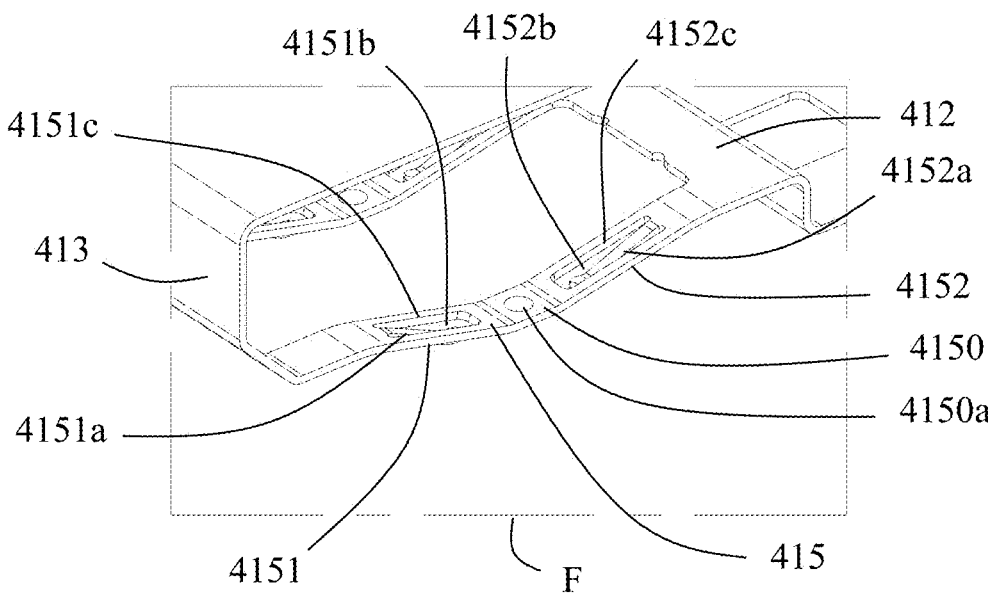
FIG. 30 is a partial enlarged view of a frame part F in FIG. 22.
Figure 31:
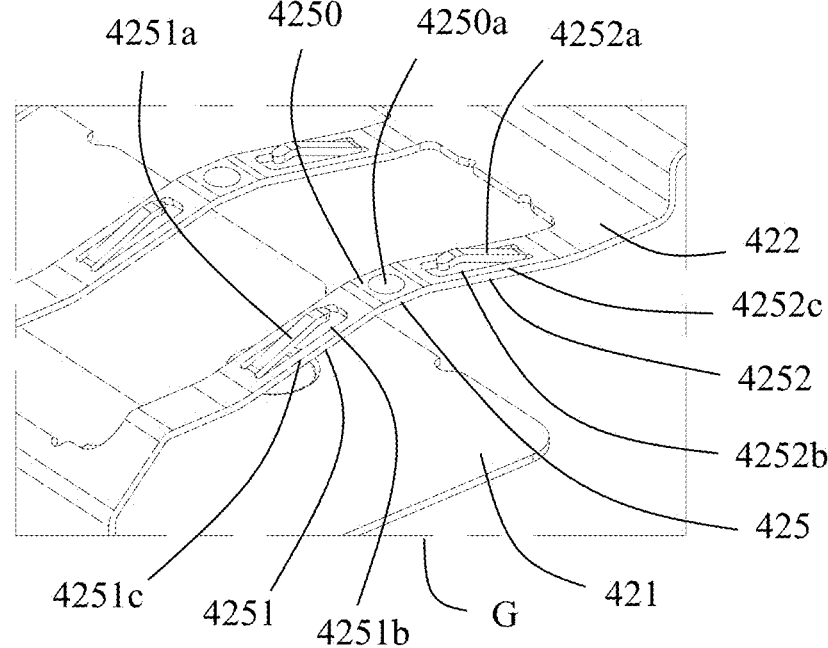
FIG. 31 is a partial enlarged view of a frame part G in FIG. 24.
Figure 32:
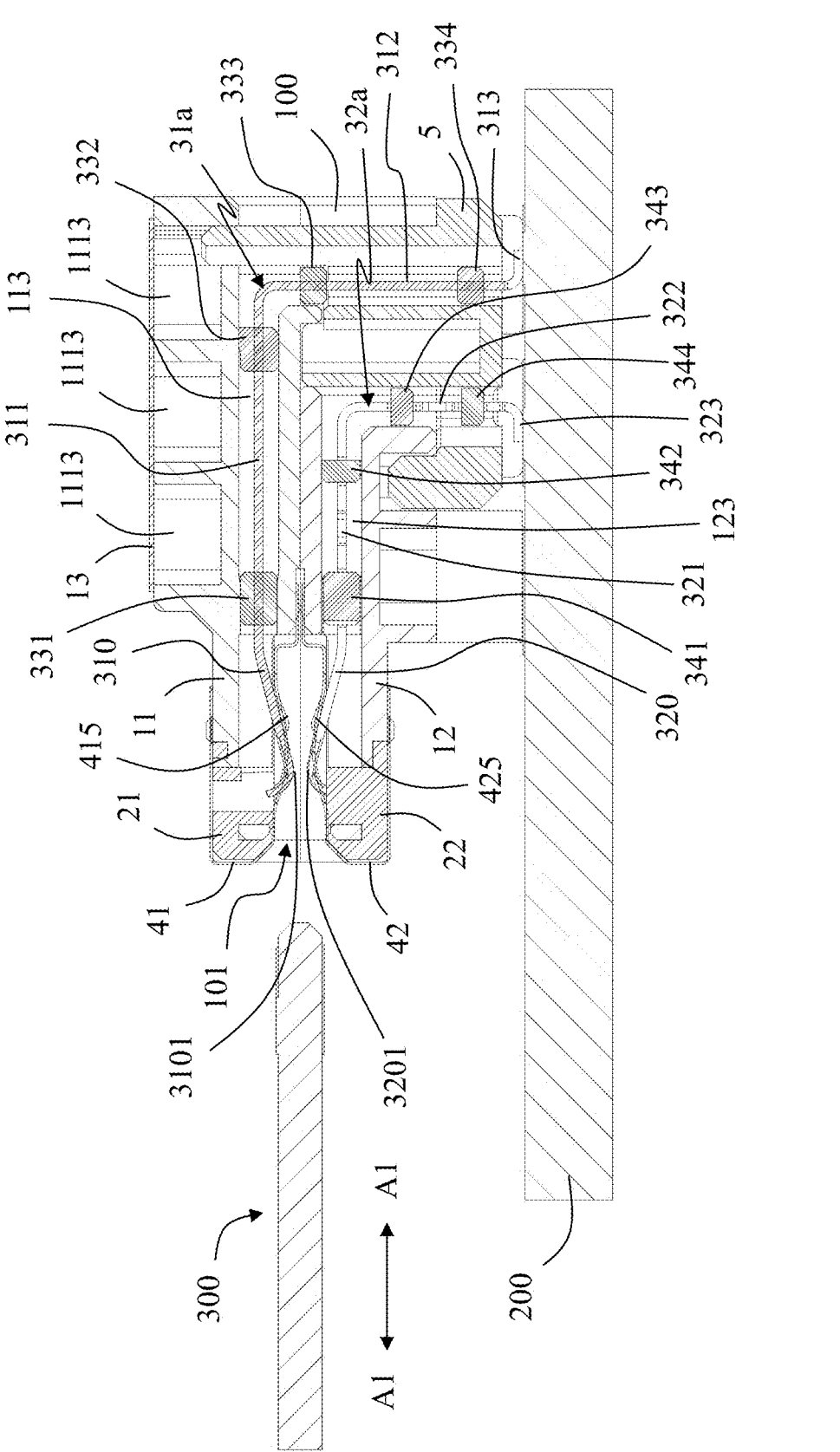
FIG. 32 is a schematic cross-sectional view of the connector assembly taken along line B-B in FIG. 3, in which the electrical connector has been installed on the circuit board.
Figure 33:
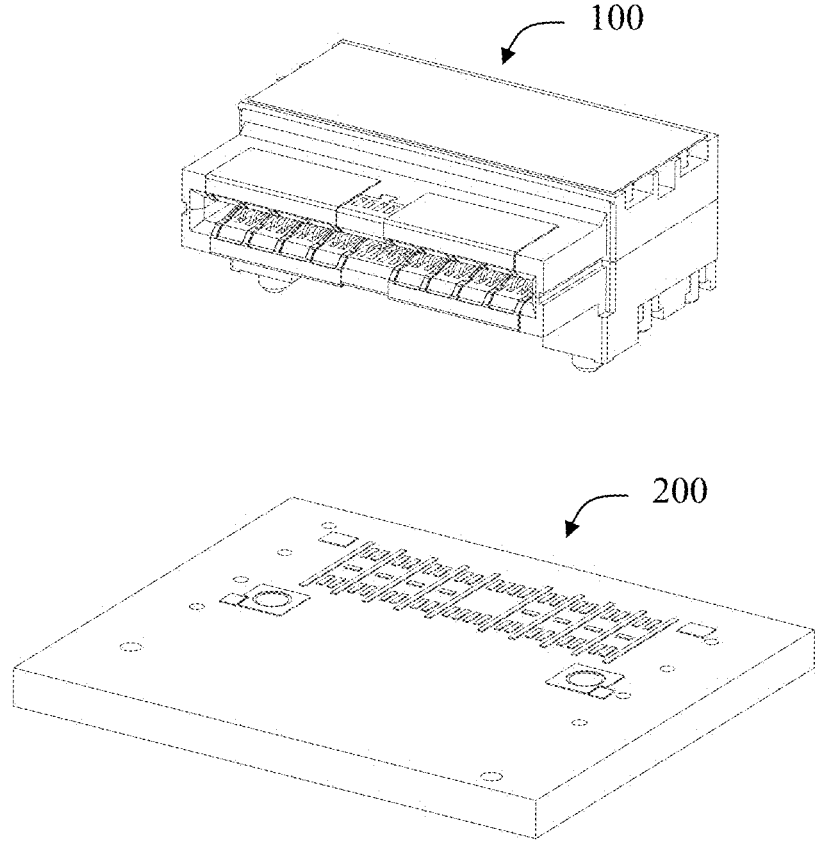
FIG. 33 is a partially exploded perspective view of the connector assembly in accordance with another embodiment of the present disclosure.
Figure 34:
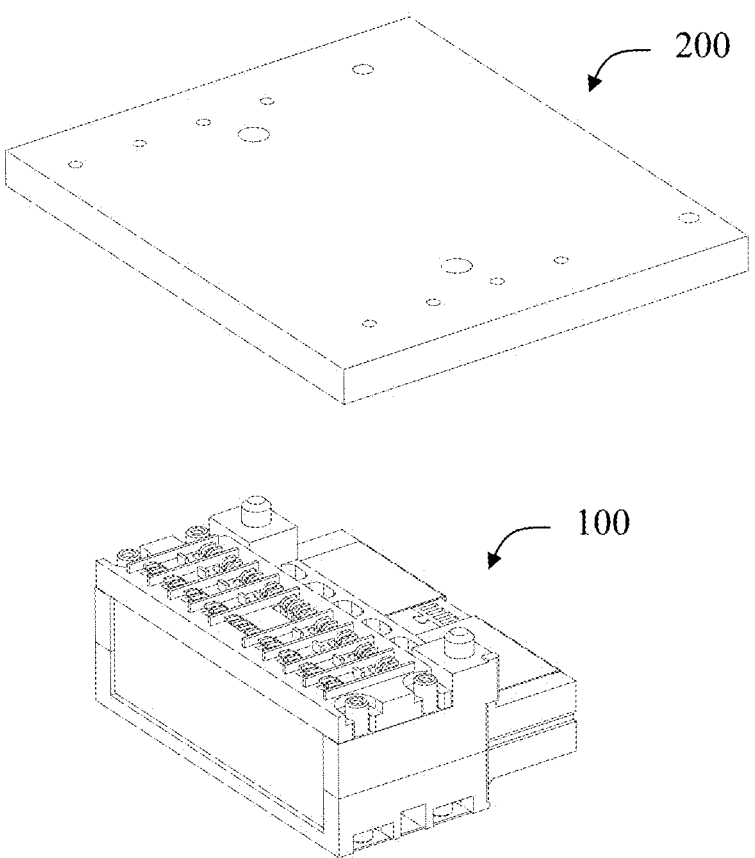
FIG. 34 is a partially exploded perspective view of FIG. 33 from another angle.
Figure 35:
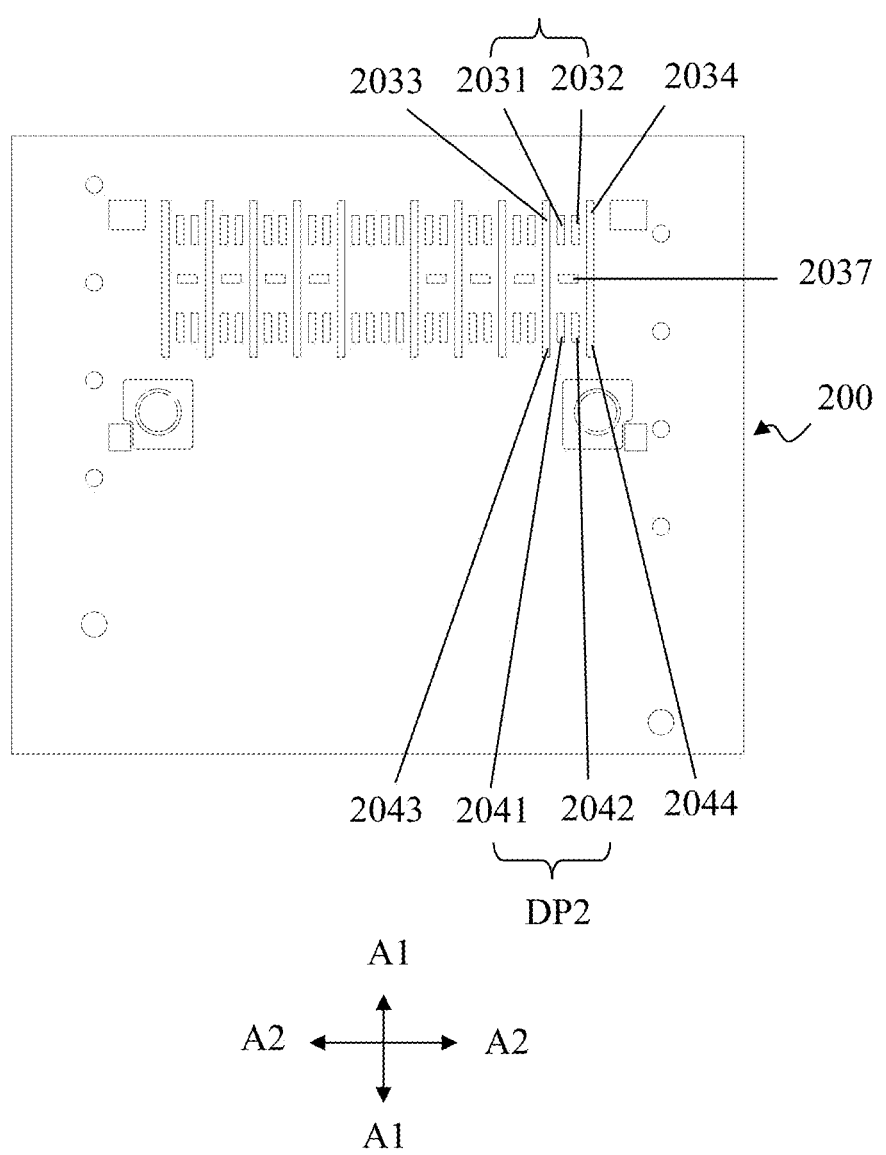
FIG. 35 is a top view of the circuit board in FIG. 33.
Figure 36:
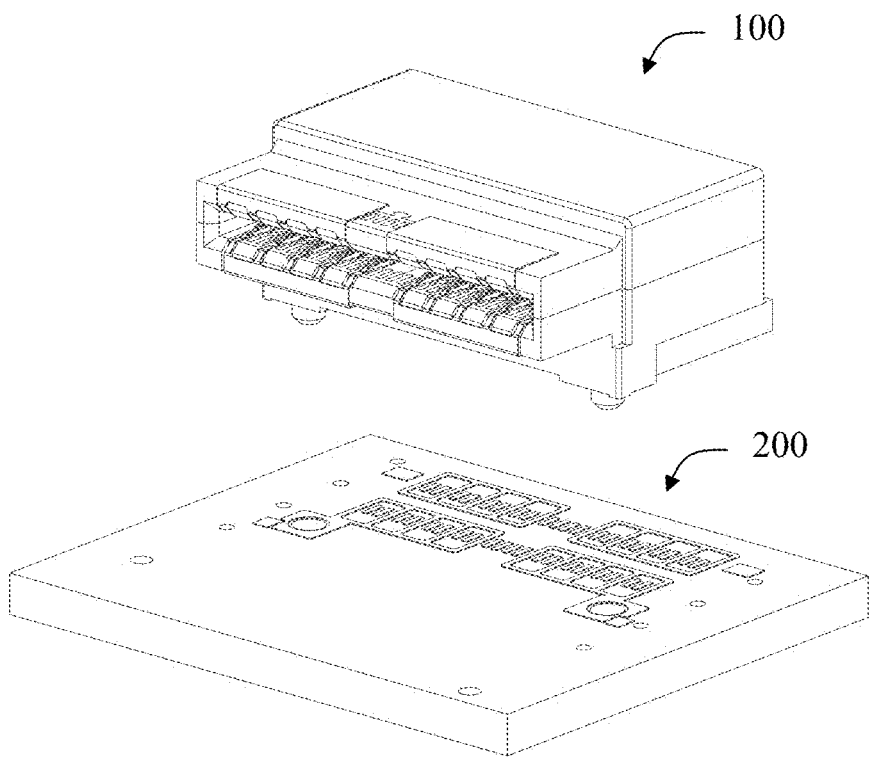
FIG. 36 is a partially exploded perspective view of the connector assembly in accordance with yet another embodiment of the present disclosure.
Figure 37:
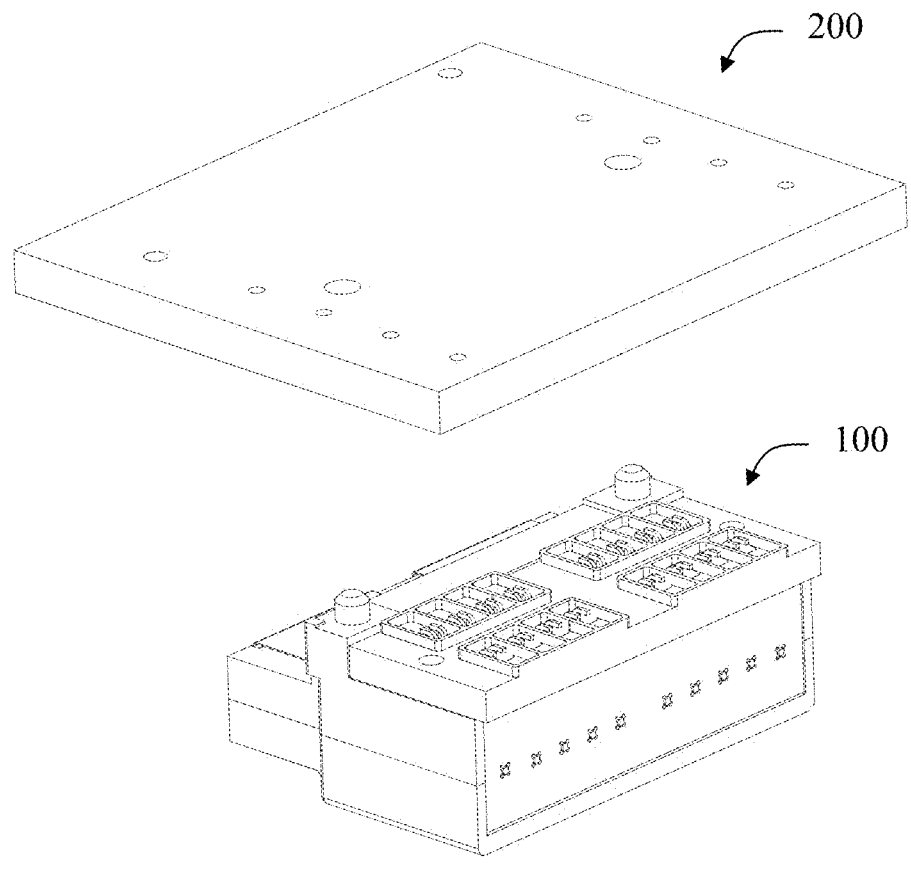
FIG. 37 is a partially exploded perspective view of FIG. 36 from another angle.
Figure 38:
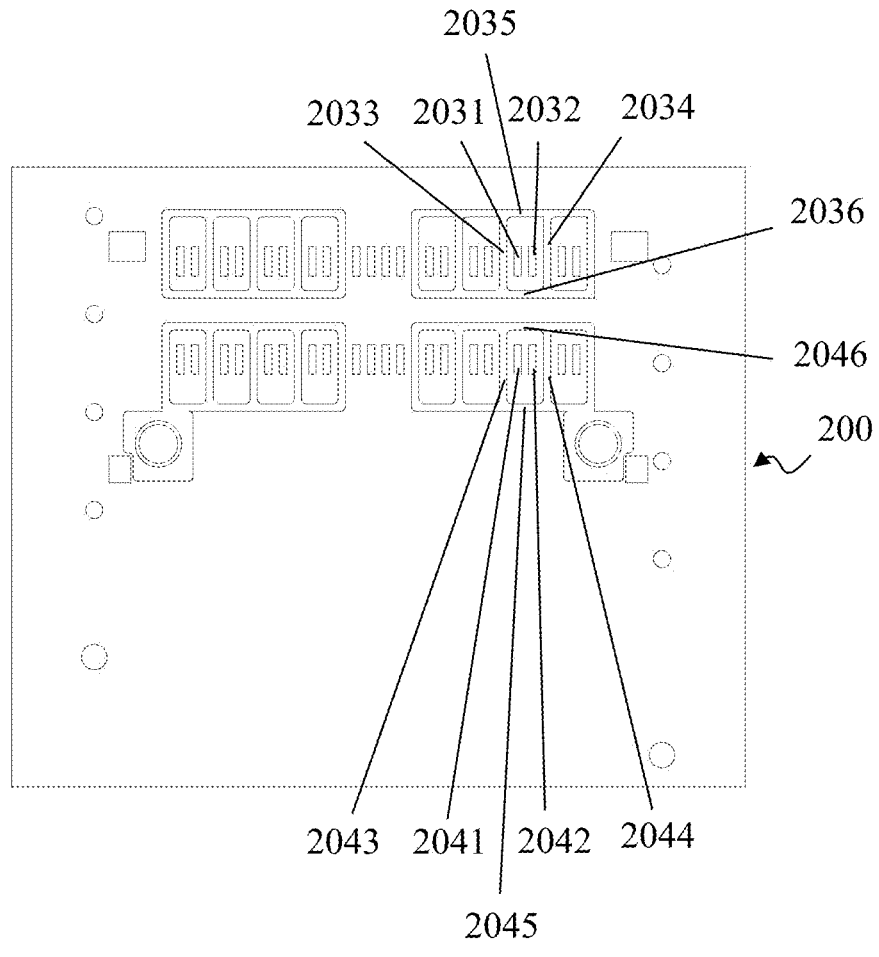
FIG. 38 is a top view of the circuit board in FIG. 36.
Figure 38:
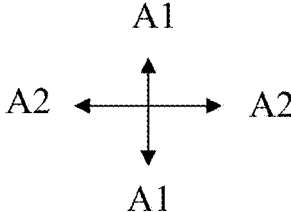

Referring to FIG. 25, in the illustrated embodiment of the present disclosure, the second conductive housing 12 further includes a plurality of second terminal module installation slots 123 extending along the first direction A1-A1. Each second terminal module installation slot 123 extends from the second base portion 121 to the second protruding portion 122. A rear end of the second terminal module installation slot 123 communicates with the receiving space 1216. The middle portion of the second terminal module installation slot 123 is circumferentially surrounded by walls of the second conductive housing 12. A front end of the second terminal module installation slot 123 extends upwardly through the fourth upper surface 1221. It is understandable to those skilled in the art that by arranging the middle portion of the second terminal module installation slot 123 to be surrounded by the walls of the second conductive housing 12 in a circumferential direction; on the one hand, the conductive terminals located in the second terminal module installation slots 123 can be better shielded; and on the other hand, the adjacent second terminal module installation slots 123 can be well separated, thereby reducing signal crosstalk.

As shown in FIG. 25, the plurality of second terminal module installation slots 123 are arranged at intervals along the second direction A2-A2. The second conductive housing 12 includes a plurality of second partition walls 124 disposed at intervals along the second direction A2-A2. Two adjacent second terminal module installation slots 123 are separated by corresponding second partition walls 124 along the second direction A2-A2. In other words, each second terminal module installation slot 123 is surrounded by four walls of the second conductive housing 12 on a length corresponding to the second partition wall 124, thereby improving the shielding effect. With this arrangement, each second terminal module installation slot 123 is relatively independent, thereby reducing signal crosstalk and improving the quality of data transmission.

Referring to FIG. 16 to FIG. 32, in the illustrated embodiment of the present disclosure, the insulating fixing block 2 includes a first insulating fixing block 21 and a second insulating fixing block 22. The first insulating fixing block 21 is fixed in the first filling grooves 1123. The second insulating fixing block 22 is fixed in the second filling grooves 1223. Preferably, in order to increase the bonding force between the first insulating fixing block 21 and the first conductive housing 11, the first insulating fixing block 21 is over-molded in the first filling grooves 1123. Similarly, in order to increase the bonding force between the second insulating fixing block 22 and the second conductive housing 12, the second insulating fixing block 22 is over-molded in the second filling grooves 1223.

The first insulating fixing block 21 defines a plurality of first slits 211 and a plurality of second slits 212, in which adjacent first slit 211 and second slit 212 form a group and communicate with a corresponding first terminal module installation slot 113. The first insulating fixing block 21 further includes a first front surface 210 which is coplanar with the first front end surface 1120 of the first protruding portion 112.

Similarly, the second insulating fixing block 22 defines a plurality of third slits 221 and a plurality of fourth slits 222. Adjacent third slit 221 and fourth slit 222 form a group and communicate with a corresponding second terminal module installation slot 123. The second insulating fixing block 22 includes a second front surface 220 which is coplanar with the second front end surface 1220 of the second protruding portion 122.

As shown in FIG. 22 to FIG. 32, the plurality of conductive terminals 3 include a plurality of first conductive terminals 31 and a plurality of second conductive terminals 32. Each first conductive terminal 31 includes a first fixing portion 311 extending along the first direction A1-A1, a first contact arm 310 extending forwardly from a front end of the first fixing portion 311, a second fixing portion 312 bent downwardly from a rear end of the first fixing portion 311, and a first mounting foot 313 extending from a bottom end of the second fixing portion 312. The first contact arm 310 includes a first contact portion 3101 that protrudes into the receiving slot 101 to contact the first signal contact pad 3041 of the tongue plate 301. In the illustrated embodiment of the present disclosure, the first mounting foot 313 horizontally extends backwardly from the bottom end of the second fixing portion 312, so as to be in contact with a corresponding first signal conductive pad 2031 and a corresponding second signal conductive pad 2032 of the circuit board 200. It is understandable to those skilled in the art that in the illustrated embodiment of the present disclosure, the first mounting feet 313 may be fixed to the corresponding first signal conductive pad 2031 and the corresponding second signal conductive pad 2032 of the circuit board 200 through SMT. Of course, in other embodiments, the first mounting feet 313 may also be disposed perpendicular to the circuit board 200. At this time, the circuit board 200 defines a plurality of through holes, and the first mounting feet 313 extend through the through holes to be fixed to the circuit board 200 by soldering or welding. In other embodiments, the first mounting feet 313 may also be disposed perpendicular to the circuit board 200. Each first mounting foot 313 defines a fisheye hole to provide a certain degree of elasticity. At this time, the circuit board 200 defines a plurality of conductive through holes, and the first mounting feet 313 can be fixed to the circuit board 200 through press-fit. The installation method of the first mounting feet 313 and the circuit board 200 can be understood by those skilled in the art, and will not be described in detail here.

In the illustrated embodiment of the present disclosure, the plurality of first conductive terminals 31 are divided into a plurality of groups. Each group of first conductive terminals 31 includes a first signal terminal S1 and a second signal terminal S2 located adjacent to the first signal terminal S1. Preferably, the first signal terminal S1 and the second signal terminal S2 in each group of first conductive terminals 31 form a differential pair to improve signal transmission speed.

In the illustrated embodiment of the present disclosure, the electrical connector 100 further includes a first holding block 33 fixed on the first signal terminal S1 and the second signal terminal S2 of each group of first conductive terminals 31. In an embodiment of the present disclosure, the first signal terminal S1 and the second signal terminal S2 are insert-molded with the first holding block 33, so as to form an integrated first terminal module 31a. The first contact portions 3101 of the first signal terminal S1 and the second signal terminal S2 in each first terminal module 31a are configured to be in contact with the first signal contact pads 3041 of the mating module 300, respectively. The first mounting foot 313 of the first signal terminal S1 and the first mounting foot 313 of the second signal terminal S2 in each first terminal module 31a are configured to be in contact with the first signal conductive pad 2031 and the second signal conductive pad 2032 of the circuit board 200, respectively. In an embodiment of the present disclosure, the first mounting foot 313 of the first signal terminal S1 and the first mounting foot 313 of the second signal terminal S2 in each first terminal module 31a are soldered or welded to the first signal conductive pad 2031 and the second signal conductive pad 2032 of the circuit board 200, respectively.

In the illustrated embodiment of the present disclosure, the first holding block 33 includes a first fixing block 331 fixed on front ends of the first fixing portions 311 of the first signal terminal S1 and the second signal terminal S2, a second fixing block 332 fixed on rear ends of the first fixing portions 311 of the first signal terminal S1 and the second signal terminal S2, a third fixing block 333 fixed on upper ends of the second fixing portions 312 of the first signal terminal S1 and the second signal terminal S2, and a fourth fixing block 334 fixed on lower ends of the second fixing portions 312 of the first signal terminal S1 and the second signal terminal S2.

Similarly, each second conductive terminal 32 includes a third fixing portion 321 extending along the first direction A1-A1, a second contact arm 320 extending forwardly from a front end of the third fixing portion 321, a fourth fixing portion 322 bent downwardly from a rear end of the third fixing portion 321, and a second mounting foot 323 extending from a bottom end of the fourth fixing portion 322. The second contact arm 320 includes a second contact portion 3201 protruding into the receiving slot 101 so as to contact the second signal contact pad 3051 of the tongue plate 301. In the illustrated embodiment of the present disclosure, the second mounting foot 323 horizontally extends forwardly from the bottom end of the fourth fixing portion 322, so as to be in contact with the third signal conductive pad 2041 and the fourth signal conductive pad 2042 of the circuit board 200. It is understandable to those skilled in the art that in the illustrated embodiment of the present disclosure, the second mounting feet 323 are soldered or welded to the third signal conductive pad 2041 and the fourth signal conductive pad 2042 of the circuit board 200 by SMT. Of course, in other embodiments, the second mounting feet 323 can also be disposed perpendicular to the circuit board 200. At this time, the circuit board 200 defines a plurality of through holes, and the second mounting feet 323 pass through the through holes to be soldered or welded to the circuit board 200. In other embodiments, the second mounting feet 323 may also be disposed perpendicular to the circuit board 200. Each second mounting foot 323 defines a fisheye hole to provide a certain degree of elasticity. At this time, the circuit board 200 defines a plurality of conductive through holes. The second mounting feet 323 can be fixed to the circuit board 200 through press-fit. The installation method of the second mounting feet 323 and the circuit board 200 can be understood by those skilled in the art, and will not be described in detail here.

In the illustrated embodiment of the present disclosure, the plurality of second conductive terminals 32 are divided into a plurality of groups, and each group of second conductive terminals 32 includes a third signal terminal S3 and a fourth signal terminal S4 located adjacent to the third signal terminal S3. Preferably, the third signal terminal S3 and the fourth signal terminal S4 in each group of second conductive terminals 32 form a differential pair to improve signal transmission speed.

In the illustrated embodiment of the present disclosure, the electrical connector 100 further includes a second holding block 34 fixed on the third signal terminal S3 and the fourth signal terminal S4 of each group of second conductive terminals 32. In one embodiment of the present disclosure, the third signal terminal S3 and the fourth signal terminal S4 are insert-molded with the second holding block 34 to form an integrated second terminal module 32a. The second contact portions 3201 of the third signal terminal S3 and the fourth signal terminal S4 in each second terminal module 32a are configured to be in contact with the second signal contact pads 3051 of the mating module 300. The second mounting foot 323 of the third signal terminal S3 and the second mounting foot 323 of the fourth signal terminal S4 in each second terminal module 32a are in contact with a corresponding third signal conductive pad 2041 and a corresponding fourth signal conductive pad 2042 of the circuit board 200, respectively. In one embodiment of the present disclosure, the second mounting foot 323 of the third signal terminal S3 and the second mounting foot 323 of the fourth signal terminal S4 in each second terminal module 32a are soldered or welded to the corresponding third signal conductive pad 2041 and the corresponding fourth signal conductive pad 2042 of the circuit board 200, respectively.

In the illustrated embodiment of the present disclosure, the second holding block 34 includes a fifth fixing block 341 fixed on front ends of the third fixing portions 321 of the third signal terminal S3 and the fourth signal terminal S4, a sixth fixing block 342 fixed on rear ends of the third fixing portions 321 of the third signal terminal S3 and the fourth signal terminal S4, a seventh fixing block 343 fixed on upper ends of the fourth fixing portions 322 of the third signal terminal S3 and the fourth signal terminal S4, and an eighth fixing block 344 fixed on lower ends of the fourth fixing portions 322 of the third signal terminal S3 and the fourth signal terminal S4.

Referring to FIG. 1 to FIG. 32, in one embodiment of the present disclosure, the electrical connector 100 further includes at least one ground sheet 4 mounted to the conductive housing 1. The ground sheet 4 includes a first ground sheet 41 and a second ground sheet 42. In the illustrated embodiment of the present disclosure, two first ground sheets 41 are provided and they are made of metal material. Two second ground sheets 42 are provided and they are made of metal material.

Each first ground sheet 41 is generally U-shaped and includes a first mounting plate 411, a second mounting plate 412 opposite to the first mounting plate 411, a first connecting plate 413 connecting one side of the first mounting plate 411 and one side of the second mounting plate 412, and a first extension plate 414 extending downwardly and backwardly from another side of the second mounting plate 412. The first mounting plate 411 defines a plurality of first mounting positioning holes 4111 that match the first positioning posts 1124. The first extension plate 414 is received in a corresponding first recess 1118 of the first conductive housing 11. The first extension plate 414 defines a plurality of first mounting holes 4141 to receive the first mounting protrusions 1119.

The first connecting plate 413 abuts against and at least partially covers the first front surface 210 of the first insulating fixing block 21. The first connecting plate 413 is located at a front end of the receiving slot 101 along the first direction A1-A1. When the mating module 300 is inserted, the tongue plate 301 may be in contact with the first connecting plate 413 first, thereby facilitating the discharge of static electricity. The second mounting plate 412 is provided with a plurality of first grounding elastic arms 415 which are disposed at intervals along the second direction A2-A2. The first grounding elastic arms 415 are disposed on two sides of the first contact arms 310 of each group of first conductive terminals 31 so as to improve the shielding effect and improve the quality of signal transmission.

The first grounding elastic arm 415 as a whole bulges away from the first mounting plate 411. Specifically, in the illustrated embodiment of the present disclosure, the first grounding elastic arm 415 includes a first intermediate portion 4150, a first elastic arm portion 4151 connecting one end of the first intermediate portion 4150 and the first connecting plate 413, and a second elastic arm portion 4152 connecting another end of the first intermediate portion 4150 and the first extension plate 414. In one embodiment of the present disclosure, the first intermediate portion 4150 includes a first dimple 4150a protruding into the receiving slot 101. The first elastic arm portion 4151 is provided with a first contact elastic arm 4151a extending toward the first intermediate portion 4150, and a first relief groove 4151b corresponding to the first contact elastic arm 4151a and providing a deformation space for the first contact elastic arm 4151a. The second elastic arm portion 4152 is provided with a second contact elastic arm 4152a extending toward the first intermediate portion 4150, and a second relief groove 4152b corresponding to the second contact elastic arm 4152a and providing a deformation space for the second contact elastic arm 4152a. In the illustrated embodiment of the present disclosure, the first contact elastic arm 4151a and the second contact elastic arm 4152a are located on two sides of the first intermediate portion 4150, respectively. The first contact elastic arm 4151a and the second contact elastic arm 4152a are aligned along the first direction A1-A1. A free end of the first contact elastic arm 4151a and a free end of the second contact elastic arm 4152a are both located adjacent to the first intermediate portion 4150. The first contact elastic arm 4151a, the first dimple 4150a and the second contact elastic arm 4152a are all in contact with the corresponding first ground contact pad 3042 of the mating module 300. This three-point contact method is beneficial to achieve better shielding effect.

In one embodiment of the present disclosure, the first elastic arm portion 4151 includes a first frame 4151c that is surrounded by all sides. The first relief groove 4151b is a closed groove and is surrounded by the first frame 4151c. The first contact elastic arm 4151a is connected to a wall of the first frame 4151c. The other three walls of the first frame 4151c respectively surround the other three sides of the first contact elastic arm 4151a. In an embodiment of the present disclosure, by arranging the first frame 4151c surrounding the first contact elastic arm 4151a, it can provide better protection for the first contact elastic arm 4151a and prevent the first contact elastic arm 4151a from being excessively deformed.

Similarly, the second elastic arm portion 4152 includes a second frame 4152c that is surrounded by all sides. The second relief groove 4152b is a closed groove and is surrounded by the second frame 4152c. The second contact elastic arm 4152a is connected to a wall of the second frame 4152c. The other three walls of the second frame 4152c respectively surround the other three sides of the second contact elastic arm 4152a. In one embodiment of the present disclosure, by arranging the second frame 4152c surrounding the second contact elastic arm 4152a, it can provide better protection for the second contact elastic arm 4152a and prevent the second contact elastic arm 4152a from being excessively deformed.

Figure 21:
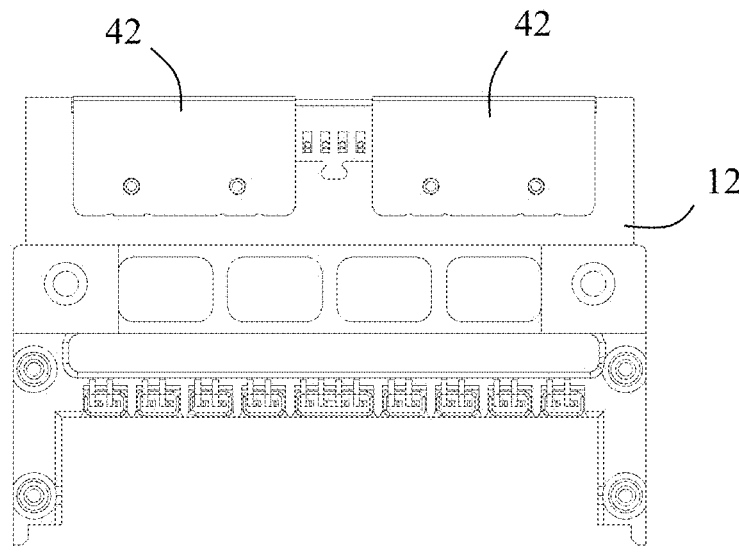
FIG. 21 is a bottom view of FIG. 16.
Figure 21:
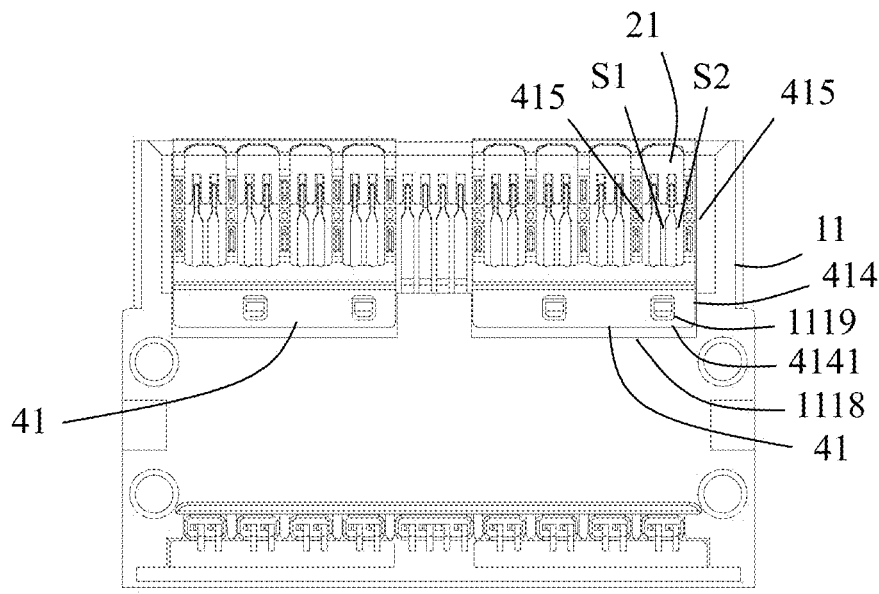
Figure 22:
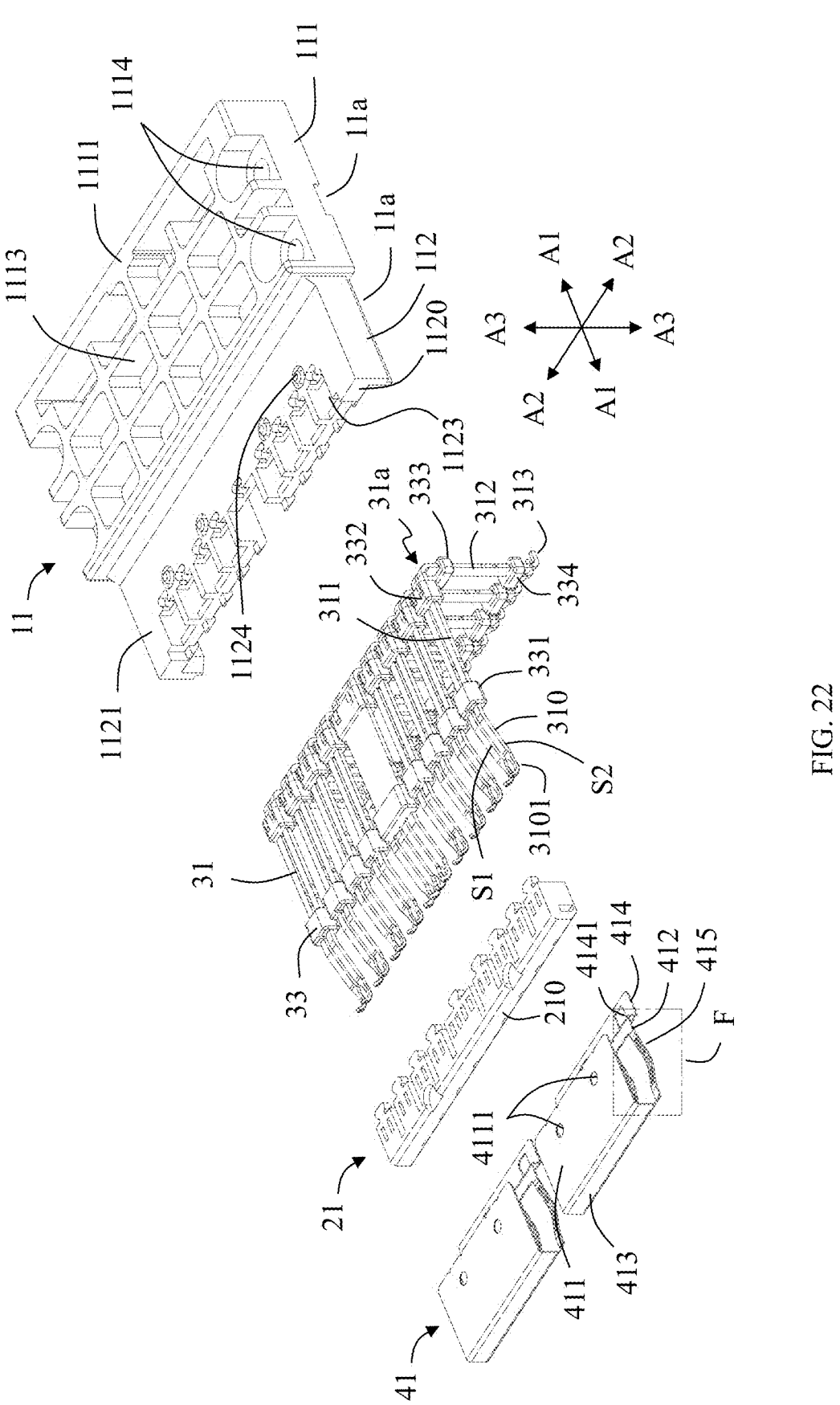
FIG. 22 is an exploded perspective view of the first conductive housing, a plurality of first terminal modules, a first insulating fixing block and a first ground sheet in FIG. 16.

In an embodiment of the present disclosure, the first positioning posts 1124 are fixed to the first mounting positioning holes 4111, so that the first mounting plate 411 is fixed to the second upper surface 1121 of the first protruding portion 112. As shown in FIG. 21, a dimension of the first mounting hole 4141 along the first direction A1-A1 may be slightly larger than a dimension of the first mounting protrusion 1119 along the first direction A1-A1. Therefore, when the first contact elastic arm 4151a, the first intermediate portion 4150 and the second contact elastic arm 4152a are contacted and deformed by the first ground contact pad 3042 of the mating module 300, the first extension plate 414 can move appropriately in the first recess 1118 along the first direction A1-A1.

Each second ground sheet 42 is generally U-shaped and includes a third mounting plate 421, a fourth mounting plate 422 opposite to the third mounting plate 421, a second connecting plate 423 connecting one side of the third mounting plate 421 and one side of the fourth mounting plate 422, and a second extension plate 424 extending downwardly and backwardly from another side of the fourth mounting plate 422. The third mounting plate 421 defines a plurality of second mounting positioning holes 4211 that match the second positioning posts 1224. The second extension plate 424 is received in a corresponding second recess 1218 of the second conductive housing 12. The second extension plate 424 defines a plurality of second mounting holes 4241 to receive the second mounting protrusions 1219.

The second connecting plate 423 abuts against and at least partially covers the second front surface 220 of the second insulating fixing block 22. The second connecting plate 423 is located at the front end of the receiving slot 101 along the first direction A1-A1. When the mating module 300 is inserted, the tongue plate 301 may be in contact with the second connecting plate 423 first, thereby facilitating the discharge of static electricity. The fourth mounting plate 422 is provided with a plurality of second grounding elastic arms 425 which are disposed at intervals along the second direction A2-A2. The second grounding elastic arms 425 are disposed on two sides of the second contact arms 320 of each group of second conductive terminals 32, respectively, so as to improve the shielding effect and improve the quality of signal transmission.

The second grounding elastic arm 425 bulges away from the third mounting plate 421 as a whole. Specifically, in the illustrated embodiment of the present disclosure, the second grounding elastic arm 425 includes a second intermediate portion 4250, a third elastic arm portion 4251 connecting one end of the second intermediate portion 4250 and the second connecting plate 423, and a fourth elastic arm portion 4252 connecting another end of the second intermediate portion 4250 and the second extension plate 424. In one embodiment of the present disclosure, the second intermediate portion 4250 includes a second dimple 4250a protruding into the receiving slot 101. The third elastic arm portion 4251 includes a third contact elastic arm 4251*a* extending toward the second intermediate portion 4250, and a third relief groove 4251*b* corresponding to the third contact elastic arm 4251*a* and providing a deformation space for the third contact elastic arm 4251*a*. The fourth elastic arm portion 4252 includes a fourth contact elastic arm 4252*a* extending toward the second intermediate portion 4250, and a fourth relief groove 4252*b* corresponding to the fourth contact elastic arm 4252*a* and providing a deformation space for the fourth contact elastic arm 4252*a*. In the illustrated embodiment of the present disclosure, the third contact elastic arm 4251*a* and the fourth contact elastic arm 4252*a* are located on two sides of the second intermediate portion 4250, respectively. The third contact elastic arm 4251*a* and the fourth contact elastic arm 4252*a* are aligned along the first direction A1-A1. A free end of the third contact elastic arm 4251*a* and a free end of the fourth contact elastic arm 4252*a* are both adjacent to the second intermediate portion 4250. The third contact elastic arm 4251*a*, the second dimple 4250*a* and the fourth contact elastic arm 4252*a* are all in contact with the second ground contact pad 3052 of the mating module 300. This three-point contact method is beneficial to achieve better shielding effect.

In one embodiment of the present disclosure, the third elastic arm portion 4251 includes a third frame 4251*c* that is surrounded by all sides. The third relief groove 4251*b* is a closed groove and is surrounded by the third frame 4251*c*. The third contact elastic arm 4251*a* is connected to a wall of the third frame 4251*c*. The other three walls of the third frame 4251*c* respectively surround the other three sides of the third contact elastic arm 4251*a*. In one embodiment of the present disclosure, by arranging the third frame 4251*c* surrounding the third contact elastic arm 4251*a*, it can provide better protection for the third contact elastic arm 4251*a* and prevent the third contact elastic arm 4251*a* from being excessively deformed.

Similarly, the fourth elastic arm portion 4252 includes a surrounding fourth frame 4252*c*. The fourth relief groove 4252*b* is a closed groove and is surrounded by the fourth frame 4252*c*. The fourth contact elastic arm 4252*a* is connected to a wall of the fourth frame 4252*c*. The other three walls of the fourth frame 4252*c* respectively surround the other three sides of the fourth contact elastic arm 4252*a*. In one embodiment of the present disclosure, by arranging the fourth frame 4252*c* surrounding the fourth contact elastic arm 4252*a*, it can provide better protection for the fourth contact elastic arm 4252*a* and prevent the fourth contact elastic arm 4252*a* from being excessively deformed.

Figure 20:
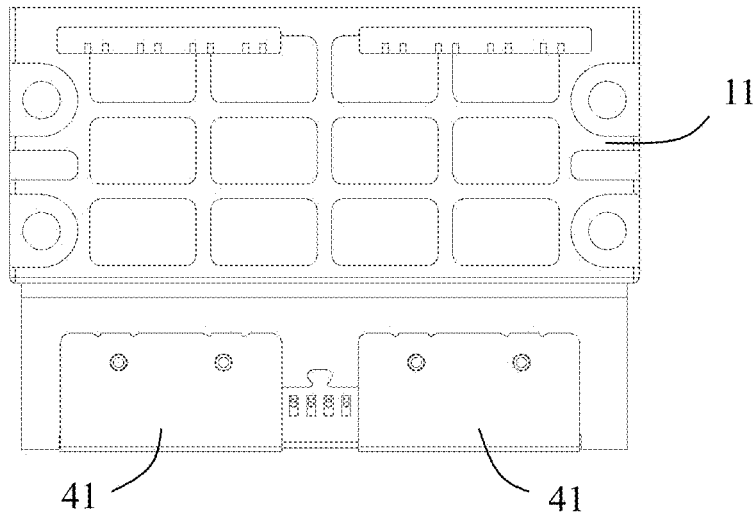
FIG. 20 is a top view of FIG. 16.
Figure 20:
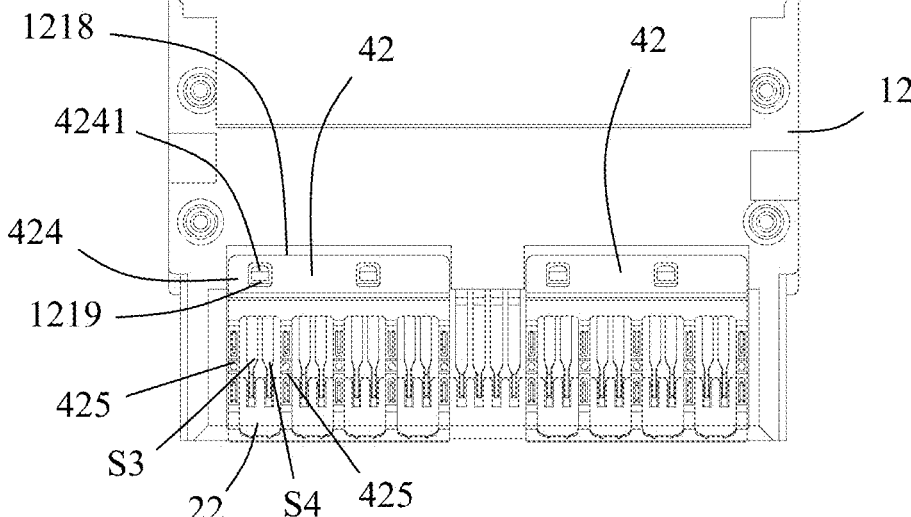

In an embodiment of the present disclosure, the second positioning posts 1224 are fixed in the second mounting positioning holes 4211, so that the third mounting plate 421 is fixed to the fourth lower surface 1222 of the second protruding portion 122. As shown in FIG. 20, a dimension of the second mounting hole 4241 along the first direction A1-A1 may be slightly larger than a dimension of the second mounting bump 1219 along the first direction A1-A1. Therefore, when the third contact elastic arm 4251*a*, the second intermediate portion 4250 and the fourth contact elastic arm 4252*a* are contacted and deformed by the second ground contact pad 3052 of the mating module 300, the second extension plate 424 can move appropriately in the second recess 1218 along the first direction A1-A1.

Referring to FIG. 11 to FIG. 15, in one embodiment of the present disclosure, the electrical connector 100 further includes a mounting block 5 mounted to the conductive housing 1. In one embodiment of the present disclosure, the mounting block 5 is a metal shell made of metal material so as to improve the shielding effect and improve the quality of signal transmission. In another embodiment of the present disclosure, the mounting block 5 may also be a composite shell formed by electroplating a metal material on an insulating material.

In an embodiment of the present disclosure, the mounting block 5 includes a base 51, a first mounting protrusion 52 extending upwardly from the base 51, a second mounting protrusion 53 extending upwardly from the base 51, a plurality of first receiving grooves 522 extending through the mounting block 5 along the third direction A3-A3, and a plurality of second receiving grooves 532 extending through the mounting block 5 along the third direction A3-A3. The base 51 defines a plurality of positioning holes 510 on two sides thereof. The positioning holes 510 match the second mounting protrusions 1214. The base 51 has a top surface 511 and a bottom surface 512. The first mounting protrusion 52 and the second mounting protrusion 53 both protrude upwardly beyond the top surface 511 of the base 51.

The plurality of first receiving grooves 522 extend upwardly through the first mounting protrusion 52. The first mounting protrusion 52 is provided with a back plate 521 that further protrudes upwardly and a plurality of third partition walls 523 that separate the plurality of first receiving grooves 522. The back plate 521 is configured to pass through the receiving space 1216 and the first mounting groove 1116, and be inserted into the first mounting slots 1117. The back plate 521 shields the second fixing portions 312 of the first conductive terminals 31 and the fourth fixing portions 322 of the second conductive terminals 32, so as to form shielding isolation from the outside. The first receiving groove 522 is used to install the fourth fixing block 334 and dispose the second fixing portions 312 of the first conductive terminals 31 overhead in the first receiving groove 522. On the one hand, this arrangement improves the shielding effect on the first conductive terminals 31. On the other hand, short circuit due to contact between the second fixing portions 312 and the mounting block 5 is avoided.

The plurality of second receiving grooves 532 extend upwardly through the second mounting protrusion 53. The second mounting protrusion 53 is provided with a mounting positioning plate 531 and a plurality of fourth partition walls 533 that separate the plurality of second receiving grooves 532. The mounting positioning plate 531 is used to be inserted into the second mounting groove 1217 to achieve installation positioning. The second receiving groove 532 is used to receive the eighth fixing block 344 and dispose the fourth fixing portions 322 of the second conductive terminals 32 overhead in the second receiving groove 532. On the one hand, this arrangement improves the shielding effect on the second conductive terminals 32. On the other hand, short circuit due to contact between the fourth fixing portions 322 and the mounting block 5 is avoided.

Figure 11:
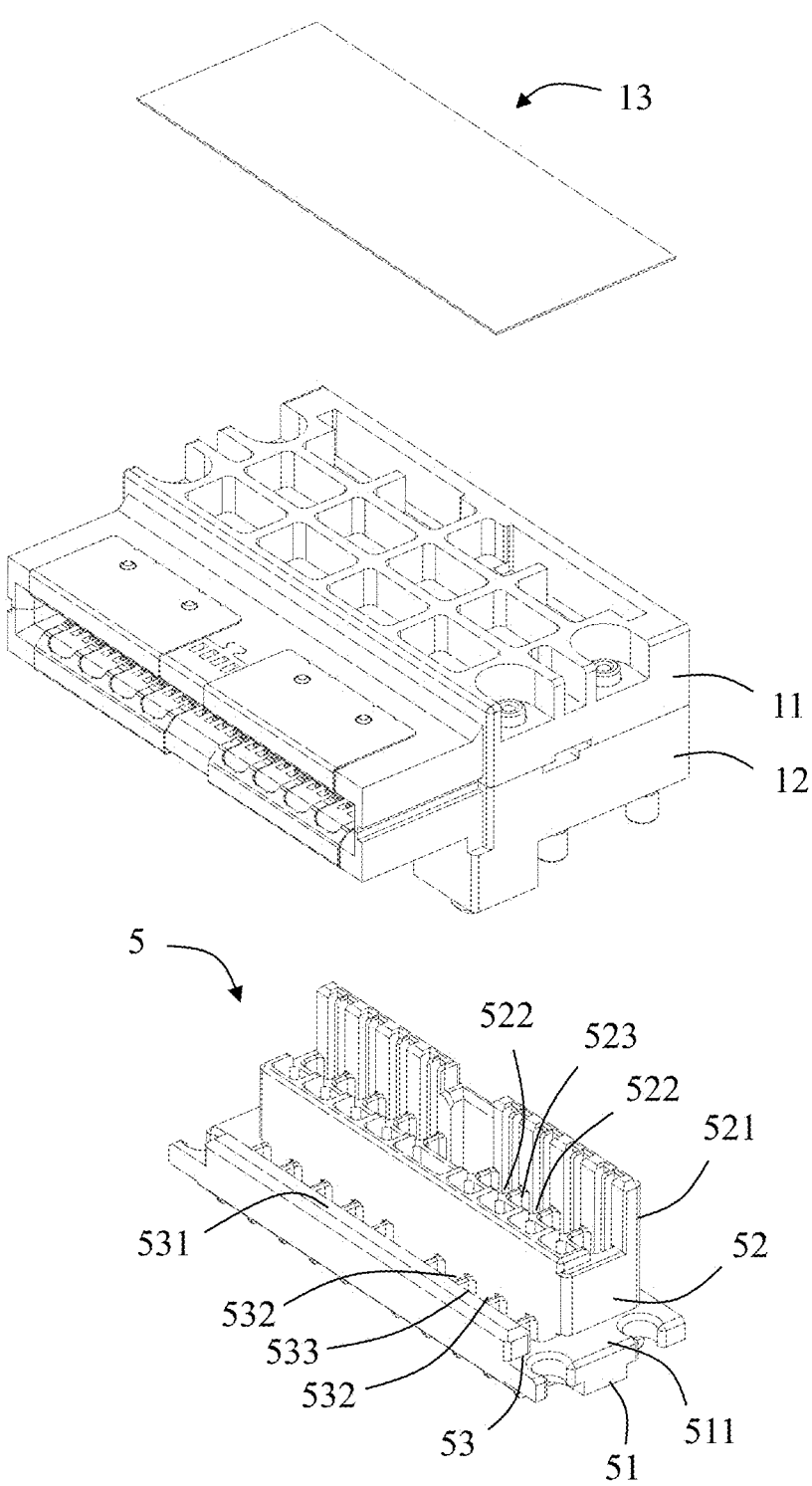
FIG. 11 is a further partially exploded perspective view of FIG. 10.

As shown in FIG. 11, in one embodiment of the present disclosure, the base 51, the first mounting protrusion 52 and the second mounting protrusion 53 are of an integral structure. The back plate 521 can better shield the second fixing portions 312 of the first conductive terminals 31 and the fourth fixing portions 322 of the second conductive terminals 32, thereby improving the quality of signal transmission.

Figure 12:
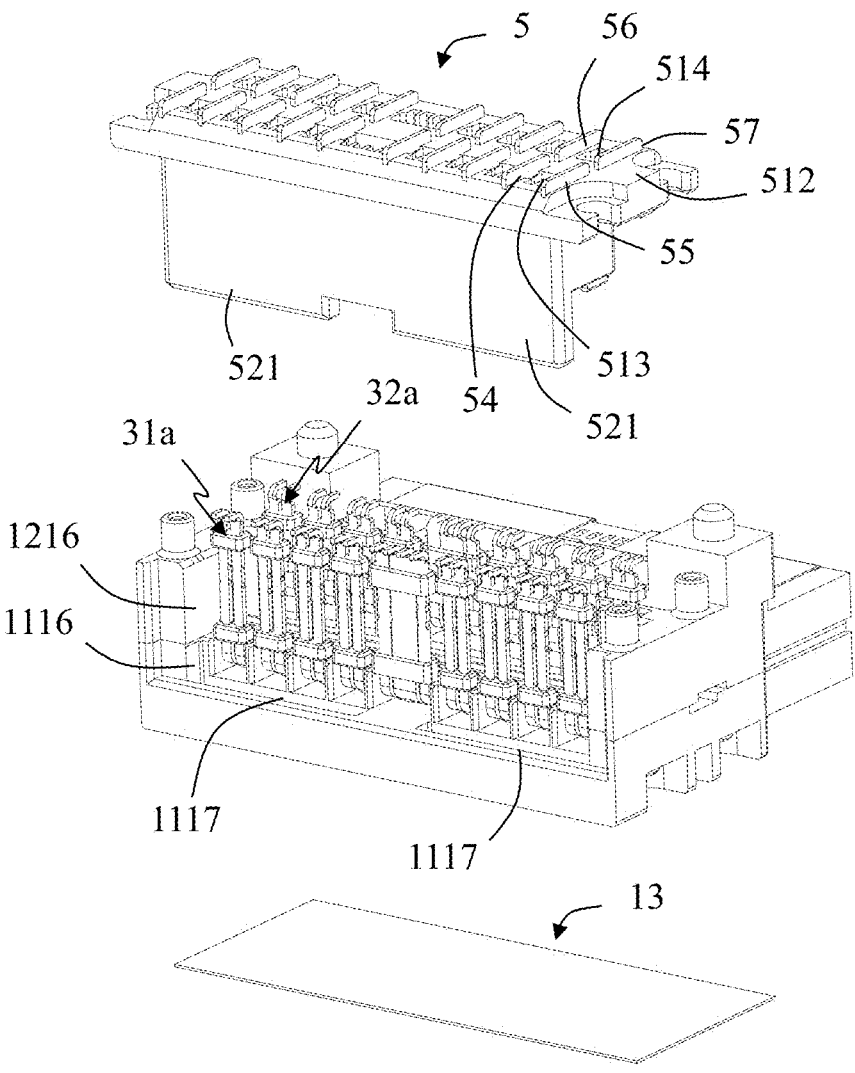
FIG. 12 is a partially exploded perspective view of FIG. 11 from another angle.
Figure 13:
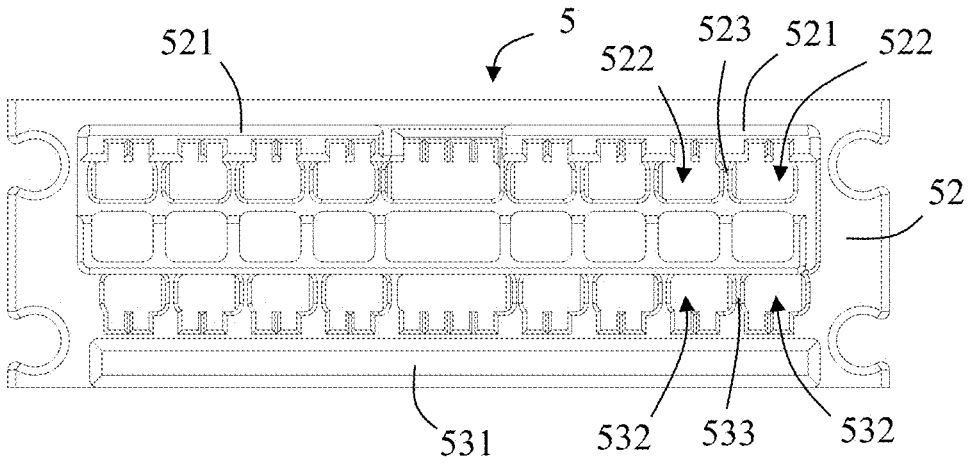
FIG. 13 is a top view of a mounting block in FIG. 11.
Figure 14:
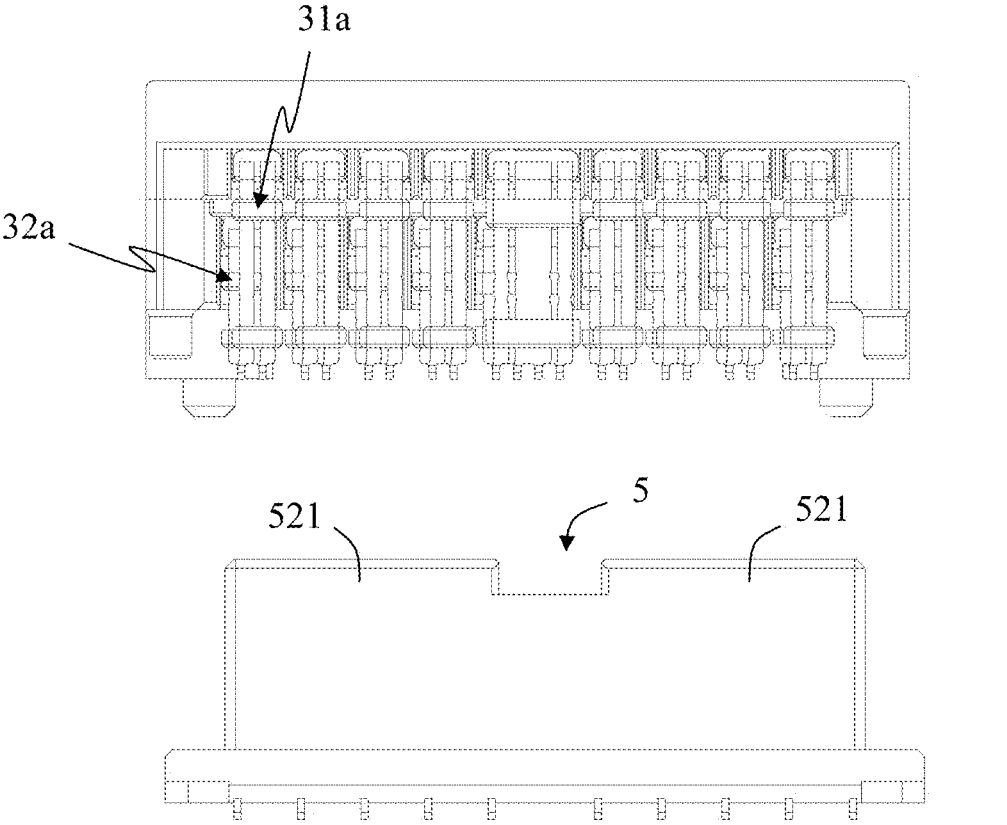
FIG. 14 is a rear view of the electrical connector when the mounting block is separated.
Figure 15:
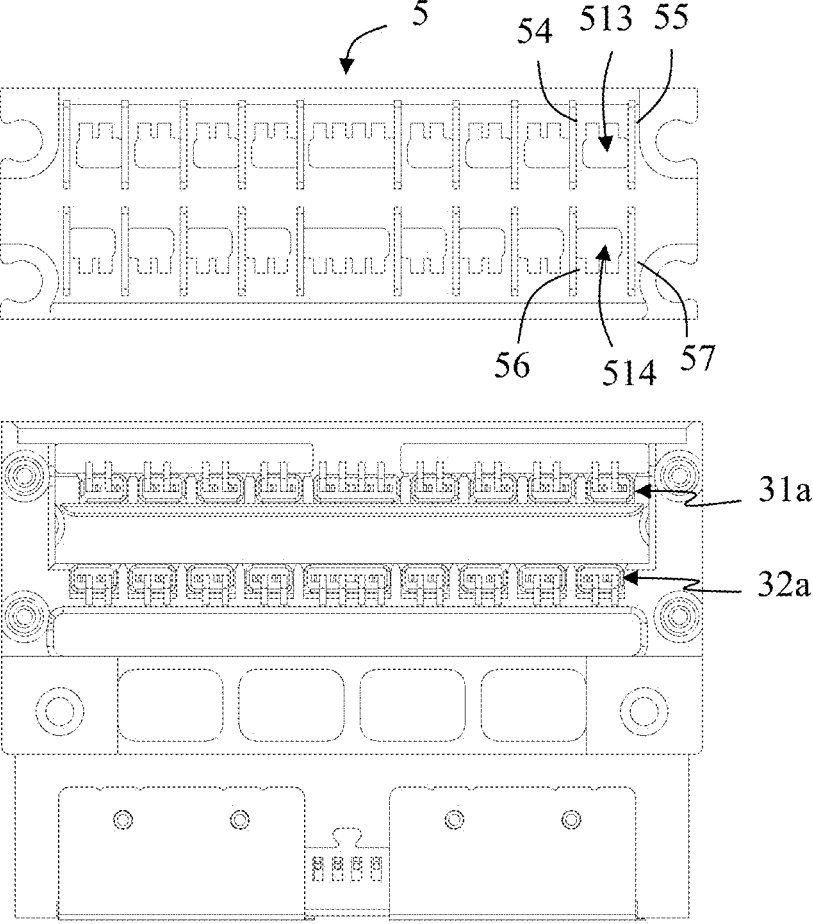
FIG. 15 is a bottom view of the electrical connector when the mounting block is separated.
Figure 16:
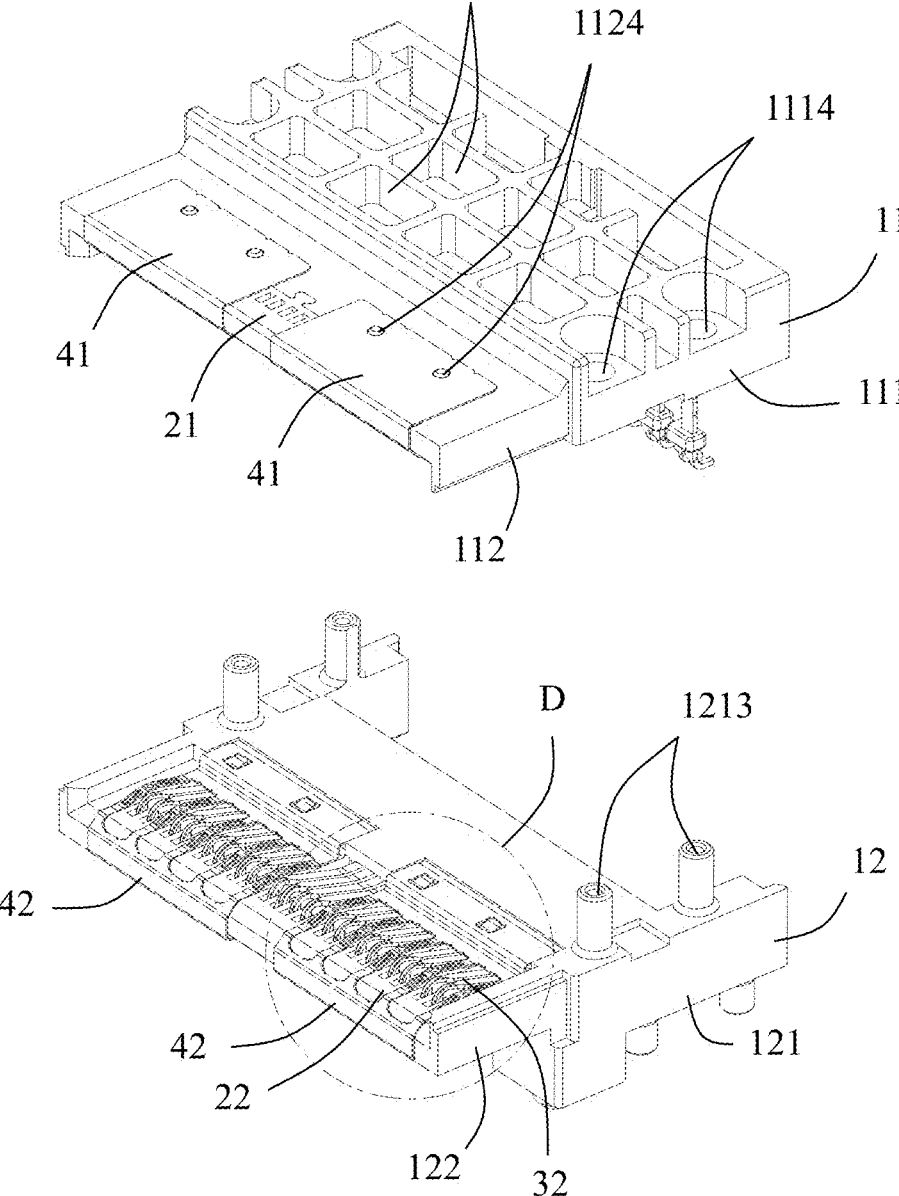
FIG. 16 is a schematic perspective view of the electrical connector after removing the mounting block and when a first conductive housing and a second conductive housing are separated from each other.
Figure 17:
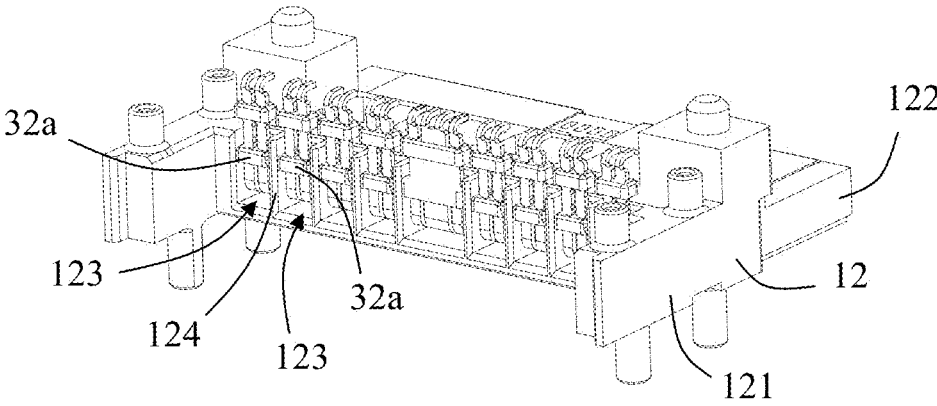
FIG. 17 is a perspective view of FIG. 16 from another angle.
Figure 17:
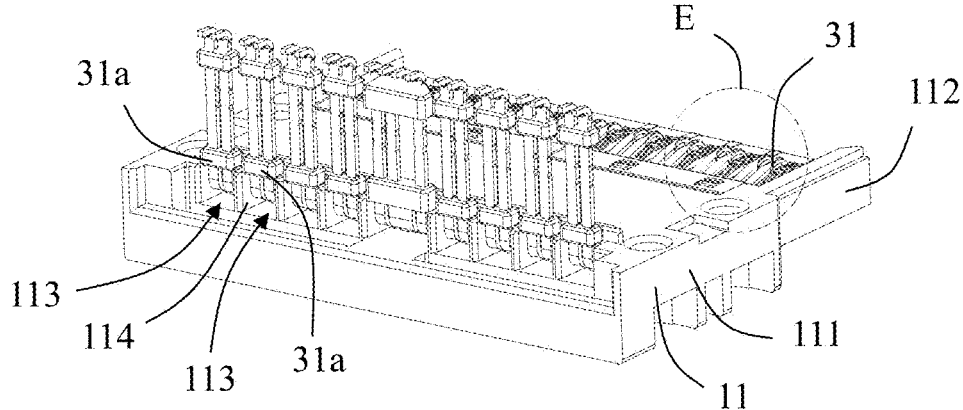
Figure 18:
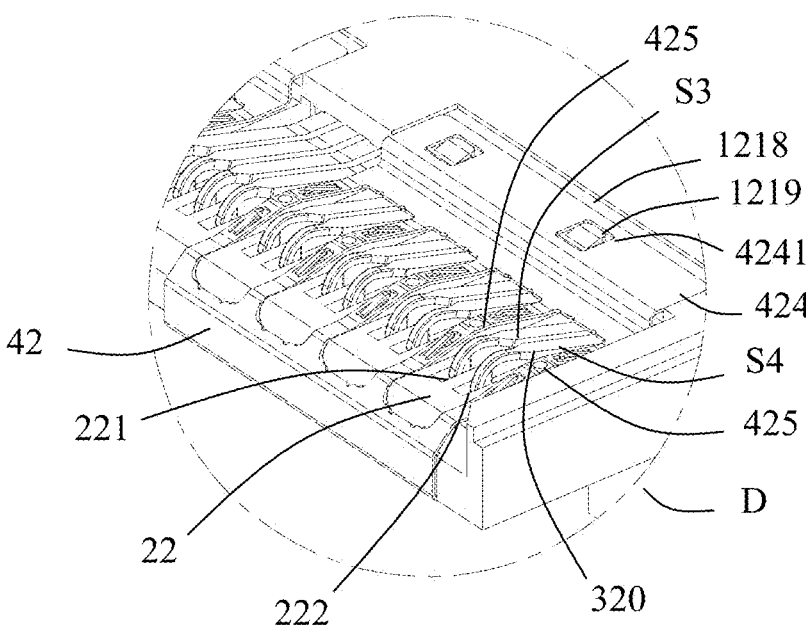
FIG. 18 is a partial enlarged view of a circled portion D in FIG. 16.
Figure 19:
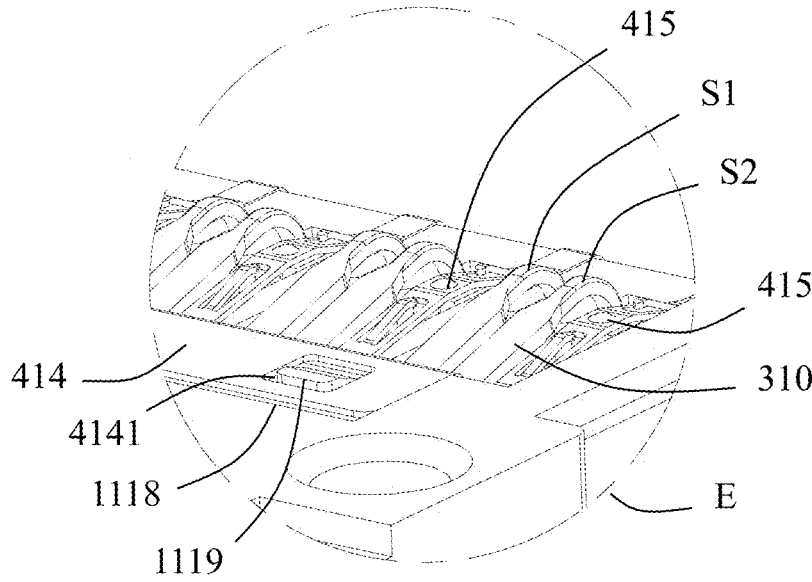
FIG. 19 is a partial enlarged view of a circled portion E in FIG. 17.

As shown in FIG. 12, in one embodiment of the present disclosure, the base 51 further defines a plurality of first through holes 513 and a plurality of second through holes 514 extending through the top surface 511 and the bottom surface 512. The first through holes 513 are used to allow the first mounting feet 313 of the first signal terminals S1 and the second signal terminals S2 in the corresponding first terminal module 31a to pass through. The second through holes 514 are used to allow the second mounting feet 323 of the third signal terminals S3 and the fourth signal terminals S4 in the corresponding second terminal module 32a to pass through. The first mounting feet 313 and the second mounting feet 323 are used for being mounted to the circuit board 200.

Referring to FIG. 4, FIG. 5 and FIG. 12 to FIG. 15, in an embodiment of the present disclosure, in order to improve the shielding of the first mounting feet 313 and the second mounting feet 323, the electrical The connector 100 further includes a plurality of first shielding ribs 54, a plurality of second shielding ribs 55, a plurality of third shielding ribs 56 and a plurality of fourth shielding ribs 57. In an embodiment of the present disclosure, the plurality of first shielding ribs 54, the plurality of second shielding ribs 55, the plurality of third shielding ribs 56 and the plurality of fourth shielding ribs 57 are all provided on the mounting block 5 and protrude downwardly from the bottom surface 512 of the base 51. Each first through hole 513 is associated with one first shielding rib 54 and one second shielding rib 55 on two sides thereof, respectively, so as to better shield the first mounting feet 313 of a group of the first signal terminal S1 and the second signal terminal S2 in first terminal module 31a, thereby improving the quality of signal transmission. Each second through hole 514 is associated with one third shielding rib 56 and one fourth shielding rib 57 on two sides thereof, respectively, so as to better shield the second mounting feet 323 of a group of the third signal terminal S3 and the fourth signal terminal S4 in the second terminal module 32a, thereby improving the quality of signal transmission.

In an embodiment of the present disclosure, the first shielding rib 54, the second shielding rib 55, the third shielding rib 56 and the fourth shielding rib 57 are all integrally formed with the base 51. Of course, in other embodiments, the first shielding rib 54, the second shielding rib 55, the third shielding rib 56 and the fourth shielding rib 57 can also be made separately from the base 51, and then assembled and fixed to the base 51.

Figure 5:
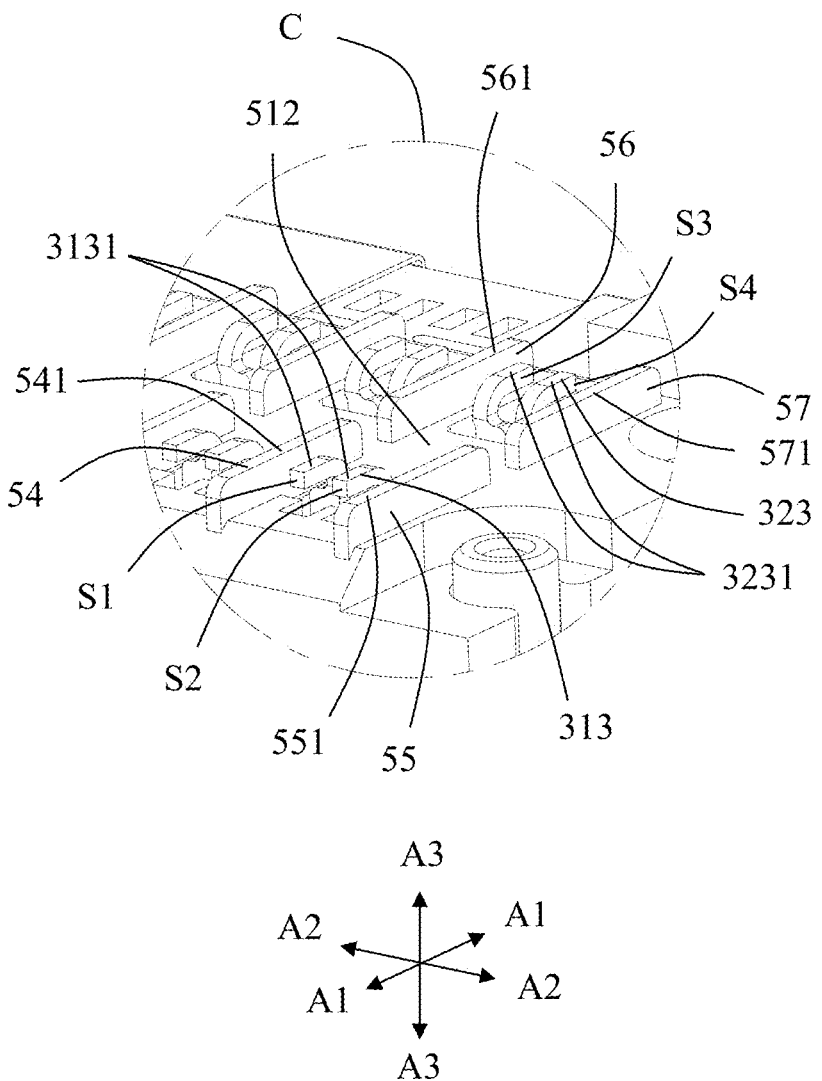
FIG. 5 is a partial enlarged view of a circled portion C in FIG. 4.

As shown in FIG. 5, in an embodiment of the present disclosure, the first shielding ribs 54 and the third shielding ribs 56 are disposed at intervals along the first direction A1-A1. The second shielding ribs 55 and the fourth shielding ribs 57 are disposed at intervals along the first direction A1-A1. The first shielding rib 54 and the third shielding rib 56 are aligned along the first direction A1-A1. The second shielding rib 55 and the fourth shielding rib 57 are aligned along the first direction A1-A1.

The first shielding rib 54 includes a first lower mounting surface 541. The second shielding rib 55 includes a second lower mounting surface 551. The third shielding rib 56 includes a third lower mounting surface 561. The fourth shielding rib 57 includes a fourth lower mounting surface 571. The first mounting foot 313 includes a first lower contact surface 3131. The second mounting foot 323 includes a second lower contact surface 3231. In order to improve the reliability of contact, in the illustrated embodiment of the present disclosure, the first lower mounting surface 541, the second lower mounting surface 551, the third lower mounting surface 561, the fourth lower mounting surface 571, the first lower contact surface 3131 and the second lower contact surface 3231 are all coplanar.

When the electrical connector 100 is mounted to the circuit board 200, the first shielding ribs 54 and the second shielding ribs 55 are in contact with the corresponding first ground conductive pads 2033 and the second ground conductive pads 2034, respectively. The third shielding ribs 56 and the fourth shielding ribs 57 are in contact with the corresponding third ground conductive pads 2043 and the fourth ground conductive pads 2044, respectively. The first mounting foot 313 of the first terminal module 31a are in contact with the corresponding first signal conductive pads 2031 and the second signal conductive pads 2032. The second mounting feet 323 of the second terminal module 32a are in contact with the corresponding third signal conductive pads 2041 and the fourth signal conductive pads 2042. In an embodiment of the present disclosure, the first shielding ribs 54 and the second shielding ribs 55 are soldered or welded to the corresponding first ground conductive pads 2033 and the second ground conductive pads 2034, respectively. The third shielding ribs 56 and the fourth shielding ribs 57 are soldered or welded to the corresponding third ground conductive pads 2043 and the fourth ground conductive pads 2044, respectively.

When assembling the electrical connector 100, firstly, the first insulating fixing block 21 is fixed in the first filling grooves 1123, and the second insulating fixing block 22 is fixed in the second filling grooves 1223.

Then, the first conductive housing 11 and the second conductive housing 12 are assembled together. The first mounting posts 1213 are inserted into the first positioning through holes 1114. The first base 111 and the second base 121 correspond vertically. The first protruding portion 112 and the second protruding portion 122 correspond vertically. The first mounting groove 1116 and the mounting space 1216 communicate vertically correspondingly. In one embodiment of the present disclosure, the first mounting posts 1213 are interference-fitted with the first positioning through holes 1114 to increase the holding force of the two. In addition, in order to further increase the bonding force between the first conductive housing 11 and the second conductive housing 12, the first conductive housing 11 and the second conductive housing 12 are soldered or welded at a joining position. For example, the first conductive housing 11 is provided with an upwardly recessed first welding groove 11a at the joining position. The second conductive housing 12 is provided with a downwardly recessed second welding groove 12a at the joining position. The first welding groove 11a and the second welding groove 12a at corresponding positions communicate with each other, thereby facilitating filling of solder in the first welding groove 11a and the second welding groove 12a, so as to achieve fixation of the first conductive housing 11 and the second conductive housing 12 by welding or soldering. When the first conductive housing 11 and the second conductive housing 12 are fixed, the receiving slot 101 for receiving the mating module 300 is formed between the first protruding portion 112 and the second protruding portion 122.

Then, the first ground sheet 41 and the second ground sheet 42 are mounted to the first conductive housing 11 and the second conductive housing 12, respectively.

Then, the first terminal modules 31a and the second terminal modules 32a are installed in the corresponding first terminal module installation slots 113 and the second terminal installation slots 123 from back to front along the first direction A1-A1. At this time, the first fixing block 331 and the second fixing block 332 are fixed in the corresponding first terminal module installation slot 113, the first fixing portions 311 of the first conductive terminals 31 are disposed overhead in the corresponding first terminal module installation slot 113, in order to avoid short circuit due to contact with the first conductive housing 11. The first contact arm 310 of the first signal terminal S1 at least partially extends into the first slit 211 of the first insulating fixing block 21. The first contact arm 310 of the second signal terminal S2 at least partially extends into the second slit 212 of the first insulating fixing block 21. Similarly, the fifth fixing block 341 and the sixth fixing block 342 are installed in the corresponding second terminal module installation slot 123, the third fixing portions 321 of the second conductive terminal 32 are disposed overhead in the second terminal module installation slot 123, in order to avoid short circuit due to contact with the second conductive housing 12. The second contact arm 320 of the third signal terminal S3 at least partially extends into the third slit 221 of the second insulating fixing block 22. The second contact arm 320 of the fourth signal terminal S4 at least partially extends into the fourth slit 222 of the second insulating fixing block 22.

Then, the mounting block 5 is mounted to the first conductive housing 11 and the second conductive housing 12. The first fixing portion 311 of the first conductive terminal 31 and the second fixing portion 312 of the first conductive terminal 31 are received in the first terminal module installation slot 113 and the first receiving groove 522, respectively. The third fixing portion 321 of the second conductive terminal 32 and the fourth fixing portion 322 of the second conductive terminal 32 are received in the second terminal module installation slot 123 and the second receiving groove 532, respectively. The first terminal module installation slot 113 is a surrounding slot surrounded by a plurality of walls of the first conductive housing 11, and adjacent first terminal module installation slots 113 are spaced apart from each other. Therefore, the first fixing portion 311 of the first conductive terminal 31 can be better shielded. The second terminal module installation slot 123 is a surrounding slot surrounded by a plurality of walls of the second conductive housing 12, and adjacent second terminal module installation slots 123 are spaced apart from each other. Therefore, the third fixing portion 321 of the second conductive terminal 32 can be better shielded. The first receiving groove 522 is a surrounding groove surrounded by a plurality of walls of the mounting block 5, and adjacent first receiving grooves 522 are spaced apart from each other. Therefore, the second fixing portion 312 of the first conductive terminal 31 can be better shielded. The second receiving groove 532 is a surrounding groove surrounded by a plurality of walls of the mounting block 5, and adjacent second receiving grooves 532 are spaced apart from each other. Therefore, the fourth fixing portion 322 of the second conductive terminal 32 can be better shielded. When the mounting block 5 is mounted in place, the mounting block 5 contacts rear ends of the first partition walls 114 and the second partition walls 124, thereby further improving the shielding effect.

It is understandable to those skilled in the art that the order of the steps in the above assembly method can be flexibly adjusted as needed, and will not be described again in the present disclosure.

Referring to FIG. 3, FIG. 10 and FIG. 11, in the illustrated embodiment of the present disclosure, the electrical connector 100 further includes a cover plate 13 fixed to the first upper surface 1111 of the first conductive housing 11 and covering the weight-reducing grooves 1113. The cover plate 13 has a flat upper surface, so that when the electrical connector 100 is mounted to the circuit board 200, a suction cup can suck the cover plate 13 and grasp the electrical connector 100. In one embodiment of the present disclosure, the cover plate 13 is a polyester film.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A circuit board, configured to mount an electrical connector, comprising:

a plurality of first signal conductive areas; each of the first signal conductive areas extending along a first direction;

a plurality of second signal conductive areas; each of the second signal conductive areas extending along the first direction; adjacent first signal conductive area and second signal conductive area being arranged side by side along a second direction to form a first signal conductive area group; the second direction being perpendicular to the first direction;

a first ground conductive area, the first ground conductive area extending along the first direction; the first ground conductive area being located on one side of the first signal conductive area group along the second direction; and a second ground conductive area, the second ground conductive area extending along the first direction; the second ground conductive area being located on another side of the first signal conductive area group along the second direction;

wherein along the second direction, two adjacent first signal conductive area groups are separated by the first ground conductive area or the second ground conductive area;

wherein the first signal conductive area is a first signal conductive pad; the second signal conductive area is a second signal conductive pad; the first ground conductive area is a first ground conductive pad; the second ground conductive area is a second ground conductive pad;

wherein a length of the first ground conductive pad along the first direction is greater than a length of the first signal conductive pad along the first direction, and is also greater than a length of the second signal conductive pad along the first direction;

a length of the second ground conductive pad along the first direction is greater than the length of the first signal conductive pad along the first direction, and is also greater than the length of the second signal conductive pad along the first direction;

wherein the circuit board further comprises:

a first ground connecting pad, the first ground connecting pad connecting one end of the first ground conductive pad and one end of the second ground conductive pad; and a second ground connecting pad, the second ground connecting pad connecting another end of the first ground conductive pad and another end of the second ground conductive pad;

wherein the first ground conductive pad, the second ground conductive pad, the first ground connecting pad and the second ground connecting pad jointly form a frame; the first signal conductive pad and the second signal conductive pad are located in the frame.

2. The circuit board according to claim 1, wherein a front edge of the first ground conductive pad extends forwardly and protrudes beyond a front edge of the first signal conductive pad and a front edge of the second signal conductive pad;

a rear edge of the first ground conductive pad extends backwardly and protrudes beyond a rear edge of the first signal conductive pad and a rear edge of the second signal conductive pad.

3. The circuit board according to claim 1, wherein a front edge of the second ground conductive pad extends forwardly and protrudes beyond a front edge of the first signal conductive pad and a front edge of the second signal conductive pad;

a rear edge of the second ground conductive pad extends backwardly and protrudes beyond a rear edge of the first signal conductive pad and a rear edge of the second signal conductive pad.

4. The circuit board according to claim 1, wherein the first signal conductive area group is a differential pair.

5. The circuit board according to claim 1, further comprising:

a third signal conductive pad, the third signal conductive pad extending along the first direction;

a fourth signal conductive pad, the fourth signal conductive pad extending along the first direction; the third signal conductive pad and the fourth signal conductive pad being arranged side by side along the second direction;

a third ground conductive pad, the third ground conductive pad extending along the first direction; the third ground conductive pad being located on one side of the third signal conductive pad and the fourth signal conductive pad along the second direction; and a fourth ground conductive pad, the fourth ground conductive pad extending along the first direction; the fourth ground conductive pad being located on another side of the third signal conductive pad and the fourth signal conductive pad along the second direction;

wherein a length of the third ground conductive pad along the first direction is greater than a length of the third signal conductive pad along the first direction, and is also greater than a length of the fourth signal conductive pad along the first direction;

a length of the fourth ground conductive pad along the first direction is greater than the length of the third signal conductive pad along the first direction, and is also greater than the length of the fourth signal conductive pad along the first direction.

6. The circuit board according to claim 5, wherein the first ground conductive pad and the third ground conductive pad are disposed at intervals along the first direction;

the second ground conductive pad and the fourth ground conductive pad are disposed at intervals along the first direction.

7. The circuit board according to claim 5, wherein the first ground conductive pad and the third ground conductive pad are aligned along the first direction;

the second ground conductive pad and the fourth ground conductive pad are aligned along the first direction.

8. The circuit board according to claim 7, wherein the first ground conductive pad and the third ground conductive pad are connected with each other along the first direction;

the second ground conductive pad and the fourth ground conductive pad are connected with each other along the first direction.

9. The circuit board according to claim 1, wherein the first signal conductive area is a first signal conductive through hole; the second signal conductive area is a second signal conductive through hole; the first ground conductive area is a first ground conductive through hole; and the second ground conductive area is a second ground conductive through hole.

10. The circuit board according to claim 1, wherein the first signal conductive area is a first signal through hole; the second signal conductive area is a second signal through hole; the first ground conductive area is a first ground through hole; and the second ground conductive area is a second ground through hole.

11. A circuit board, configured to mount an electrical connector, comprising:

a plurality of first signal conductive areas; each of the first signal conductive areas extending along a first direction;

a plurality of second signal conductive areas; each of the second signal conductive areas extending along the first direction; adjacent first signal conductive area and second signal conductive area being arranged side by side along a second direction to form a first signal conductive area group; the second direction being perpendicular to the first direction;

a first ground conductive area, the first ground conductive area extending along the first direction; the first ground conductive area being located on one side of the first signal conductive area group along the second direction; and a second ground conductive area, the second ground conductive area extending along the first direction; the second ground conductive area being located on another side of the first signal conductive area group along the second direction;

wherein along the second direction, two adjacent first signal conductive area groups are separated by the first ground conductive area or the second ground conductive area;

wherein the first signal conductive area is a first signal through hole; the second signal conductive area is a second signal through hole; the first ground conductive area is a first ground through hole; and the second ground conductive area is a second ground through hole.

12. A connector assembly, comprising a circuit board and an electrical connector mounted on the circuit board;

the electrical connector comprising:

a housing, the housing defining a first terminal module installation slot;

a first terminal module, the first terminal module being partially received in the first terminal module installation slot; the first terminal module comprising two first conductive terminals which are a first signal terminal and a second signal terminal, respectively; each first conductive terminal comprising a first mounting foot protruding beyond the housing; the first mounting foot of the first signal terminal and the first mounting foot of the second signal terminal being arranged side by side along a second direction;

25 a first shielding rib, the first shielding rib being located on one side of the first mounting foot of the first signal terminal and the first mounting foot of the second signal terminal along the second direction; and a second shielding rib, the second shielding rib being located on another side of the first mounting foot of the first signal terminal and the first mounting foot of the second signal terminal along the second direction;

the circuit board comprising:

a plurality of first signal conductive pads; each of the first signal conductive pads extending along a first direction; the second direction being perpendicular to the first direction;

a plurality of second signal conductive pads; each of the second signal conductive pads extending along the first direction; adjacent first signal conductive pad and second signal conductive pad being arranged side by side along the second direction to form a first signal conductive pad group;

a first ground conductive pad, the first ground conductive pad extending along the first direction; the first ground conductive pad being located on one side of the first signal conductive pad group along the second direction; and a second ground conductive pad, the second ground conductive pad extending along the first direction; the second ground conductive pad being located on another side of the first signal conductive pad group along the second direction;

wherein along the second direction, two adjacent first signal conductive pad groups are separated by the first ground conductive pad or the second ground conductive pad;

a length of the first ground conductive pad along the first direction is greater than a length of the first signal conductive pad along the first direction, and is also greater than a length of the second signal conductive pad along the first direction;

a length of the second ground conductive pad along the first direction is greater than the length of the first signal conductive pad along the first direction, and is also greater than the length of the second signal conductive pad along the first direction;

wherein the first mounting foot of the first signal terminal is electrically connected to the first signal conductive pad; the first mounting foot of the second signal terminal is electrically connected to the second signal conductive pad; the first shielding rib is electrically connected to the first ground conductive pad; and the second shielding rib is electrically connected to the second ground conductive pad.

13. The connector assembly according to claim 12, wherein a front edge of the first ground conductive pad extends forwardly and protrudes beyond a front edge of the first signal conductive pad and a front edge of the second signal conductive pad;

a rear edge of the first ground conductive pad extends backwardly and protrudes beyond a rear edge of the first signal conductive pad and a rear edge of the second signal conductive pad.

14. The connector assembly according to claim 12, wherein a front edge of the second ground conductive pad extends forwardly and protrudes beyond a front edge of the first signal conductive pad and a front edge of the second signal conductive pad;

a rear edge of the second ground conductive pad extends backwardly and protrudes beyond a rear edge of the first signal conductive pad and a rear edge of the second signal conductive pad.

15. The connector assembly according to claim 12, wherein the first signal conductive area group is a differential pair.

16. The connector assembly according to claim 12, wherein the circuit board further comprises:

a third signal conductive pad, the third signal conductive pad extending along the first direction;

a fourth signal conductive pad, the fourth signal conductive pad extending along the first direction; the third signal conductive pad and the fourth signal conductive pad being arranged side by side along the second direction;

a third ground conductive pad, the third ground conductive pad extending along the first direction; the third ground conductive pad being located on one side of the third signal conductive pad and the fourth signal conductive pad along the second direction; and a fourth ground conductive pad, the fourth ground conductive pad extending along the first direction; the fourth ground conductive pad being located on another side of the third signal conductive pad and the fourth signal conductive pad along the second direction;

wherein a length of the third ground conductive pad along the first direction is greater than a length of the third signal conductive pad along the first direction, and is also greater than a length of the fourth signal conductive pad along the first direction;

a length of the fourth ground conductive pad along the first direction is greater than the length of the third signal conductive pad along the first direction, and is also greater than the length of the fourth signal conductive pad along the first direction.

17. The connector assembly according to claim 16, wherein the first ground conductive pad and the third ground conductive pad are disposed at intervals along the first direction;

the second ground conductive pad and the fourth ground conductive pad are disposed at intervals along the first direction.

18. The connector assembly according to claim 16, wherein the first ground conductive pad and the third ground conductive pad are aligned along the first direction;

the second ground conductive pad and the fourth ground conductive pad are aligned along the first direction.

19. The connector assembly according to claim 18, wherein the first ground conductive pad and the third ground conductive pad are connected with each other along the first direction;

the second ground conductive pad and the fourth ground conductive pad are connected with each other along the first direction.

* * * * *